(12) United States Patent
Takahashi et al.

(10) Patent No.: US 7,847,657 B2
(45) Date of Patent: Dec. 7, 2010

(54) LONGITUDINALLY COUPLED RESONATOR-TYPE SURFACE ACOUSTIC WAVE FILTER

(75) Inventors: Masaki Takahashi, Tokyo (JP); Seisuke Mochizuka, Tokyo (JP); Michiyuki Nakazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 301 days.

(21) Appl. No.: 12/046,921

(22) Filed: Mar. 12, 2008

(65) Prior Publication Data
US 2008/0238576 A1    Oct. 2, 2008

(30) Foreign Application Priority Data
Mar. 30, 2007    (JP)    ............... 2007-093357

(51) Int. Cl.
*H03H 9/64*    (2006.01)
(52) U.S. Cl. ....................... 333/193; 333/195
(58) Field of Classification Search .......... 333/193, 333/195
See application file for complete search history.

(56) References Cited

U.S. PATENT DOCUMENTS

| | | | |
|---|---|---|---|
| 6,420,946 B1 * | 7/2002 | Bauer et al. ............... 333/193 |
| 6,972,643 B2 * | 12/2005 | Tsunekawa et al. ......... 333/195 |
| 7,053,733 B2 * | 5/2006 | Yata et al. ................. 333/195 |
| 7,071,796 B2 * | 7/2006 | Ueda et al. ................ 333/195 |
| 7,330,089 B2 * | 2/2008 | Yata .......................... 333/195 |
| 7,504,911 B2 * | 3/2009 | Otsuka et al. .............. 333/195 |
| 2008/0079512 A1 | 4/2008 | Nakazawa et al. |

FOREIGN PATENT DOCUMENTS

| | | |
|---|---|---|
| JP | 2002-9588 | 1/2002 |
| JP | 2002-528987 | 9/2002 |
| JP | 2003-92527 | 3/2003 |
| JP | 2003-243964 | 8/2003 |

* cited by examiner

*Primary Examiner*—Robert Pascal
*Assistant Examiner*—Alan Wong
(74) *Attorney, Agent, or Firm*—Oblon, Spivak, McClelland, Maier & Neustadt, L.L.P.

(57) ABSTRACT

Disclosed is a surface acoustic wave filter comprising two or more IDTs arranged in a propagation direction of the surface acoustic wave, wherein said two or more IDTs include at least one pair of IDTs arranged adjacent to each other in order to be acoustically coupled to each other, and have different numbers of paired electrode fingers, and a pitch between each neighboring two of almost all of the electrode fingers included in one of the pair of IDTs which has the smaller number of paired electrode fingers is made different from one to another in order that the IDTs should include no primary pitch area.

17 Claims, 15 Drawing Sheets

LONGITUDINALLY COUPLED RESONATOR-TYPE SURFACE ACOUSTIC WAVE FILTER

BACKGROUND OF THE INVENTION

The present invention relates to a surface acoustic wave filter, and more particularly relates to a technique which achieves favorable filter characteristics of a longitudinally coupled resonator-type surface acoustic wave filter by reducing the loss of the filter and by improving reflection characteristics of the filter.

Surface acoustic wave (SAW) filters employ a surface acoustic wave which is generated due to a piezoelectric effect. Thus, the surface acoustic wave filters are highly reliable as well as compact and lightweight. For this reason, surface acoustic wave filters are widely used as transmit-receive filters, antenna branching filters and the like of mobile communication devices in these years. This type of surface acoustic wave filter is generally composed of a plurality of interdigital transducers (hereinafter shortened to "IDTs"), each for exciting a surface acoustic wave, which are formed on a piezoelectric substrate, and which are electrically or acoustically connected to one another.

A ladder-type structure and a longitudinally coupled resonator-type structure are each known as the structure in which IDTs are connected to one another. In the ladder-type structure, a plurality of IDTs are connected in a ladder shape. In the longitudinally coupled resonator-type structure, a plurality of IDTs are arranged in a propagation path in which their surface acoustic waves propagate, and are acoustically coupled to one another. Generally in a broad band, the longitudinally coupled resonator-type structure has better attenuation characteristics than the ladder-type structure, and has characteristics that it is easy to extract not only unbalanced signals but also balanced signals.

Longitudinally coupled resonator-type surface acoustic wave filters are disclosed in the following patent documents: Japanese Patent Application Laid-open Publication No. 2002-9588 (hereinafter referred to as "Patent Document 1"); Japanese Patent Translation Publication No. 2002-528987 (hereinafter referred to as "Patent Document 2"); Japanese Patent Application Laid-open Publication No. 2003-92527 (hereinafter referred to as "Patent Document 3"); and Japanese Patent Application Laid-open Publication No. 2003-243965 (hereinafter referred to as "Patent Document 4").

SUMMARY OF THE INVENTION

Although the inventions as recited in these patent documents succeed in improving the filter characteristics of their respective longitudinally coupled resonator-type surface acoustic wave filters, there is still large room for further improvement of the filters.

In Patent Document 1, the longitudinally coupled resonator-type surface acoustic wave filter maintains its pitch continuity between interdigital transducers. This is achieved by making the pitch $\lambda I1$ between some electrode fingers located adjacent to the end of each IDT smaller than the pitch $\lambda I2$ between the other electrode fingers in the IDT. This makes it possible to suppress the bulk radiation, thus making the bandwidth wider, and reducing the insertion loss. In the following descriptions, the pitch between some electrode fingers which is made different from the pitch between the other electrode fingers will be referred to as a "secondary pitch," the narrower pitch in the secondary pitch will be referred to as a "narrower pitch," and the pitch between the other electrode fingers which occupy a most part of electrodes in the IDT and have a constant pitch will be referred to as a "primary pitch."

In Patent Document 2, the filter includes two IDT facing portions each having a transition area. Moreover, the pitch between the electrode fingers is made continuously smaller in the transition area, and is made continuously larger beyond the boundary of the transition area. In this way, the bulk wave radiation is reduced, as well as the bandwidth thereof is made wider, and the insertion loss thereof is reduced. In addition, in Patent Document 3, the filter includes electrode fingers, whose pitch is narrower, in a vicinity of each IDT facing portion. Moreover, a pitch between the electrode fingers in a primary pitch area $P1$ in an IDT having the larger number of paired electrode fingers is made larger than a pitch between the electrode fingers in a primary pitch area $P2$ in an IDT having the smaller number of paired electrode fingers. In this way, the bandwidth of the filter is made wider.

In the conventional types of filters as recited in Patent Documents 1 to 3, the pitch between the electrode fingers is changed in various ways. However, it is difficult to maintain the periodic continuity of the surface acoustic wave by use of its secondary pitch area only, and the bulk wave radiation is reduced within a certain limit only. As a result, none of these filters are capable of suppressing their insertion losses sufficiently. This is because the pitch between the electrode fingers among a most part of electrodes (more than 70% of all of the paired electrode fingers) included in each IDT in each of these is set constant (or this is because each IDT in each of these includes a primary pitch area) so that the pitch between the electrode fingers is changed only in a part of each end portion of each IDT.

By contrast, in Patent Document 4, each of two adjacent IDTs in the filter is divided into a plurality of blocks. By means of gradually changing the pitch between the electrode fingers in each of the blocks, the phase of a surface acoustic wave generated by one of the two adjacent IDTs is made continuous with the phase of a corresponding surface acoustic wave generated by the other of the two adjacent IDTs. In this way, the bulk wave radiation is made smaller, as well as the bandwidth thereof is made wider, and the insertion loss thereof is made reduced.

Nevertheless, as clear from the descriptions of the examples in Patent Document 4, each of the filters according to the example still includes a primary pitch area which occupies a most part of IDT (an area which has the underlined number of paired electrode fingers as follows). Specifically, each numbers of paired electrode fingers in the three arranged IDTs are (13 pairs-2 pairs-1.5 pairs)-(2 pairs-13.5 pairs-2 pairs)-(1.5 pairs-2 pairs-13 pairs), respectively, and each pitch of those electrodes are (2.065 μm-1.995 μm-1.855 μm)-(1.920 μm-2.040 μm-1.920 μm)-(1.855 μm-1.995 μm-2.065 μm), respectively (see Patent Document 4, paragraphs 0067 to 0068). The invention as recited in Patent Document 4 is based on the same technical thoughts as the inventions as recited in Patent Documents 1 to 3. For this reason, it is likely that the invention as recited in Patent Document 4 may cause the same types of problems as the inventions as recited in Patent Documents 1 to 3.

In addition, there is a problem common among the inventions as recited in Patent Documents 1 to 4. The proportion of the primary pitch area in one of each two adjacent IDTs, which has the smaller number of paired electrode fingers, is smaller than the proportion of the primary pitch area in the other of the two adjacent IDTs, which has the larger number of paired electrode fingers. In the conventional types of IDT configurations, it is likely that this smallness of the primary pitch area deteriorates the reflection characteristics.

With the foregoing problems taken into consideration, an object of the present invention is to achieve more favorable characteristics of a surface acoustic wave filter, particularly a longitudinally coupled resonator-type surface acoustic wave filter, by reducing the insertion loss of the filter and improving the reflection characteristics thereof.

For the purpose of achieving the object by solving the foregoing problems, the surface acoustic wave filter according to the present invention includes two or more interdigital transducers, provided on a piezoelectric substrate, and arranged in a propagation direction of a surface acoustic wave. In the surface acoustic wave filter, the pitch between each neighboring two of almost all the electrode fingers included in at least one of the interdigital transducers is made different from one to another in order that the interdigital transducer should include no primary pitch area.

The surface acoustic wave filter according to the present invention is different from the conventional type of filter in that at least one IDT is designed to include no primary pitch area. In this respect, the "primary pitch area" occupies a most part of an IDT (for example, more than 50% of all the electrode fingers included in the IDT), and in the "primary pitch area," the pitch between the electrode fingers is constant (unchanged).

Specific means for preventing at least one IDT from including any primary pitch area is achieved by making the pitch between each neighboring two of almost all the electrode fingers included in the IDT different from one to another. The above description "Making the pitch between each neighboring two of almost all the electrode fingers included in an IDT different from one to another" typically means making the pitch between each neighboring two of completely all the electrode fingers included in the IDT different from one to another, but is not limited to this case. That description includes making the pitch between each neighboring two of a most part of electrode fingers included therein (for example, 60% to 70% of the electrode fingers included therein; desirably, more than 80% of the electrode fingers included therein; and more desirably, more than 90% of the electrode fingers included therein) different from the pitch between each neighboring two of the rest of electrode fingers included therein. In addition, that description also includes changing the pitch between the electrode fingers stepwise (for example, gradually or irregularly changing the pitch between each several electrode fingers, specifically each two electrode fingers, each three electrode fingers, each four electrode fingers or each 5 to 10 electrode fingers, from one to another).

It does not matter whether or not the pitch between each neighboring two of completely all the electrode fingers included in the IDT is made different from one to another. This is because making the pitch between each neighboring two of the most part of electrode fingers included therein different from the pitch between each neighboring two of the rest of electrode fingers included therein, and gradually or irregularly changing the pitch between each several electrode fingers from one to another, are virtually equivalent to making the pitch between each neighboring two of completely all the electrode fingers included therein different from one to another. As a result, the latter two schemes bring about their own effects similar to that which the former scheme brings about. Incidentally, in a case where the pitch between each several electrode fingers is stepwise changed from one to another, "each several electrode fingers" should not necessarily include the number of electrode fingers throughout the single IDT. The single IDT may include a plurality of electrode finger groups: in some groups, the pitch between each two electrode fingers is changed from one to another; in other groups, the pitch between each three electrode fingers is changed from one to another; and in the other groups, the pitch between each four electrode fingers is changed from one to another.

Furthermore, in the case where, as describe above, the pitch between each several electrode fingers is changed from one to another, the number of electrode finger groups included in the single IDT should be, for example, three or more; desirably, four or more; and more desirably, five or more, but less than the total number of the electrode fingers included in the IDT. Moreover, in the case where, as describe above, the pitch between each several electrode fingers is changed from one to another, it is desirable that the number of paired electrode fingers included in the largest number of electrode finger groups should be, for example, less than 30% of the total of paired electrode fingers included in the single IDT.

Unlike the conventional type of IDT, the IDT according to the present invention, which has the configuration including no primary pitch area (where the pitch between each neighboring two in a large number of electrode fingers is constant), makes it unnecessary that the periodic continuity (phase continuation) of the surface acoustic wave should be maintained only by the secondary pitch area provided in the end portion of the IDT. As a result, the IDT according to the present invention makes it possible to control the pitch between the electrode fingers by use of the entire IDT in order to maintain the periodic continuity of the surface acoustic wave, and accordingly to reduce the insertion loss by decreasing the bulk wave radiation in a more favorable manner.

In a case where two IDTs whose numbers of paired electrode fingers are different from each other are adjacent to each other, particularly if the foregoing filter configuration (IDT configuration) according to the present invention is applied to an IDT which has the smaller number of paired electrode fingers, the filter configuration (IDT configuration) is more effective for preventing the characteristics from deteriorating in the IDT.

Specifically, in a case where the filter according to the present invention includes at least one pair of IDTs which are arranged adjacent to each other in order for the pair of IDTs to be acoustically coupled, and whose numbers of paired electrode fingers are different from each other, the pitch between each neighboring two of almost all the electrode fingers included in an IDT which has the smaller number of paired electrode fingers is made different from one to another in order that the IDT should include no primary pitch area.

Furthermore, the similar IDT configuration may be applied to the other of the two IDTs, which has the larger number of paired electrode fingers, in addition to the IDT which has the smaller number of paired electrode fingers. In other words, the pitch between each neighboring two of almost all the electrode fingers included in each of the pair of IDTs may be made different from one to another in order that the pair of IDTs should include no primary pitch area.

In the filter according to the present invention, it is desirable that the largest pitch between the electrode fingers in the IDT which has the smaller number of paired electrode fingers should be smaller than the largest pitch between the electrode fingers in the IDT which has the larger number of paired electrode fingers, and that the smallest pitch between the electrode fingers in the IDT which has the smaller number of paired electrode fingers should be larger than the smallest pitch between the electrode fingers in the IDT which has the larger number of paired electrode fingers. This configuration makes it possible to make smaller change in the pitch between the electrode fingers in the IDT which has the smaller number of paired electrode fingers, and accordingly to further improve the periodic continuity of the surface acoustic wave.

Moreover, in the case where, as described above, the pitch between the electrode fingers in an IDT is intended to be made different from one to another in order that the IDT should include no primary pitch area, it is desirable that the pitch should not be monotonously from one to another. Specifically, it is desirable that the IDT should include at least one pitch-decreasing area where the pitch between the electrode fingers included in the IDT is gradually decreased, and at lease one pitch-increasing area where the pitch between the electrode fingers included therein is gradually increased.

Specifically, it is desirable that this non-monotonous pitch change should be achieved, for example, in a way that in each of the endmost IDTs (outermost IDTs) of a plurality of IDTs arranged in the propagation direction of the surface acoustic wave, the pitch between the electrode fingers is gradually decreased from the outside toward the inside, and in an inner end portion (inside portion) of the each IDT, subsequently is reversely increased and thereafter is decreased again. Here, "inside" means a side near to the center of the whole of a plurality of IDTs arranged in the propagation direction of the surface acoustic wave, and "outside" means a side near to either end of the whole of a plurality of IDTs.

On the other hand, among a plurality of IDTs arranged in the propagation direction of the surface acoustic wave, an IDT interposed between its two neighboring IDTs (an IDT whose two ends are adjacent to the two neighboring IDTs) includes an area in which, as a whole, the pitch between the electrode fingers is larger in its central portion, and is decreased gradually toward its two ends, as well as is decreased in a part of its central portion.

The IDT configuration according to the present invention is desirably applicable to the longitudinally (vertically) coupled resonator multi-mode type surface acoustic wave filter. The filter includes: two or more IDTs as the IDTs arranged in the propagation direction of the surface acoustic wave; and reflectors respectively arranged at the two sides of a group consisting of the two or more IDTs. In addition, the filter according to the present invention uses multiple resonant modes in the two or more IDTs.

Furthermore, on the basis of the present invention, it is possible to make a filter from which a balanced signal output is capable of being obtained. Specifically, the surface acoustic wave filter according to any one of the foregoing aspects of the present invention may be used in pair as two surface acoustic wave filters electrically connected in parallel between an input terminal and an output terminal, the phase of an output signal from one of the filters being different by substantially 180 degrees from the phase of a corresponding output signal from the other of the filters, the input terminal drawn out from the connecting point being an unbalanced terminal, and the output terminal being a balanced terminal.

In addition, one or more surface acoustic wave resonator may be connected in series or in parallel to each of the foregoing surface acoustic wave filters. Moreover, a plurality of filters may be cascade-connected into multiple stages, or may be connected in any other manner. Furthermore, any one of a balanced terminal and an unbalanced terminal may be selected for each of the input and out terminals connected to a plurality of filters (any one of a combination of a balanced input terminal with a balanced output terminal, a combination of an unbalanced input terminal with an unbalanced output terminal, a combination of a balanced input terminal with an unbalanced output terminal, and a combination of an unbalanced input terminal with a balanced output terminal may be selected).

Furthermore, the IDT configuration according to any one of the foregoing aspects of the present invention is applicable to a boundary acoustic wave filter in addition to the surface acoustic wave filter.

Specifically, the boundary acoustic wave filter includes: a piezoelectric substrate; a non-piezoelectric material (for example, a non-piezoelectric substrate or a non-piezoelectric film) arranged in contact with the piezoelectric substrate; two or more IDTs provided in the boundary surface between the piezoelectric substrate and the non-piezoelectric material in a way that the two or more IDTs are arranged in a propagation direction of a boundary acoustic wave. In the boundary acoustic wave filter, a pitch between each neighboring two of almost all the electrode fingers included in at least one of the IDTs is made different from one to another in order that the IDT should include no primary pitch area.

Moreover, in the same manner as the surface acoustic wave filter, the boundary acoustic wave filter may include at least one pair of IDTs, which are arranged adjacent to each other in order for the pair of IDTs to be acoustically coupled, and whose numbers of paired electrode fingers are different from each other. Furthermore, in the boundary acoustic wave filter, the pitch between each neighboring two of almost all the electrode fingers included in one of the pair of IDTS, which has the smaller number of paired electrode fingers, may be made different from one to another in order that the IDT should include no primary pitch area. Otherwise the pitch between each neighboring two of almost all the electrode fingers included in each of the pair of IDTs may be made different from one to another in order that the pair of IDTs should include no primary pitch area. It is more desirable that the largest pitch between the electrode fingers included in a first one of the pair of IDTs, which has the smaller number of paired electrode fingers, should be smaller than the largest pitch between the electrode fingers in a second one of the pair of IDTs, which has the larger number of paired electrode fingers, and that the smallest pitch between the electrode fingers included in the first one of the pair of IDTs should be larger than the smallest pitch between the electrode fingers included in the second one of the pair of IDTs.

On the basis of the present invention, it is possible to make a longitudinally coupled resonator multi-mode type boundary acoustic wave filter which includes three or more IDTs as the IDTs arranged in the propagation direction of the boundary acoustic wave as well as reflectors respectively arranged at the two sides of a group consisting of the three or more IDTs, and which uses multiple resonant modes in the three or more IDTs. Moreover, in the same manner as the surface acoustic wave filter, it is possible to make a filter from which a balanced signal output is capable of being obtained, when the boundary acoustic wave filter is used in pair as two boundary acoustic wave filters electrically connected in parallel, the phase of an output signal from one of the two boundary acoustic wave filters being different by substantially 180 degrees from the phase of a corresponding output signal from the other of the two boundary acoustic wave filters. In addition, one or more boundary acoustic wave resonator may be connected in series or in parallel to each of the foregoing boundary acoustic wave filters. Moreover, a plurality of filters may be cascade-connected into multiple stages, or may be connected in any other manner. Furthermore, any one of a balanced terminal and an unbalanced terminal may be selected for each of the input and out terminals connected to a plurality of filters.

The present invention makes it possible to reduce the insertion loss of the surface or boundary acoustic wave filter and improve the reflection characteristics thereof, and thereby to further enhance the filter characteristics.

Other objects, features and advantages of the invention will become apparent from the following description of the embodiments of the invention taken in conjunction with the accompanying drawings. In the drawings, similar reference characters denote similar elements throughout the several views.

DESCRIPTIONS OF THE PREFERRED EMBODIMENTS

Descriptions will be provided hereinbelow for the embodiments of the present invention. First of all, descriptions will be provided for a conventional type of longitudinally coupled resonator-type surface acoustic wave filter. Subsequently, descriptions will be provided for longitudinally coupled resonator surface acoustic wave filters according to the respective embodiments of the present invention by comparing the filters with the conventional type of filter.

Figure 22:
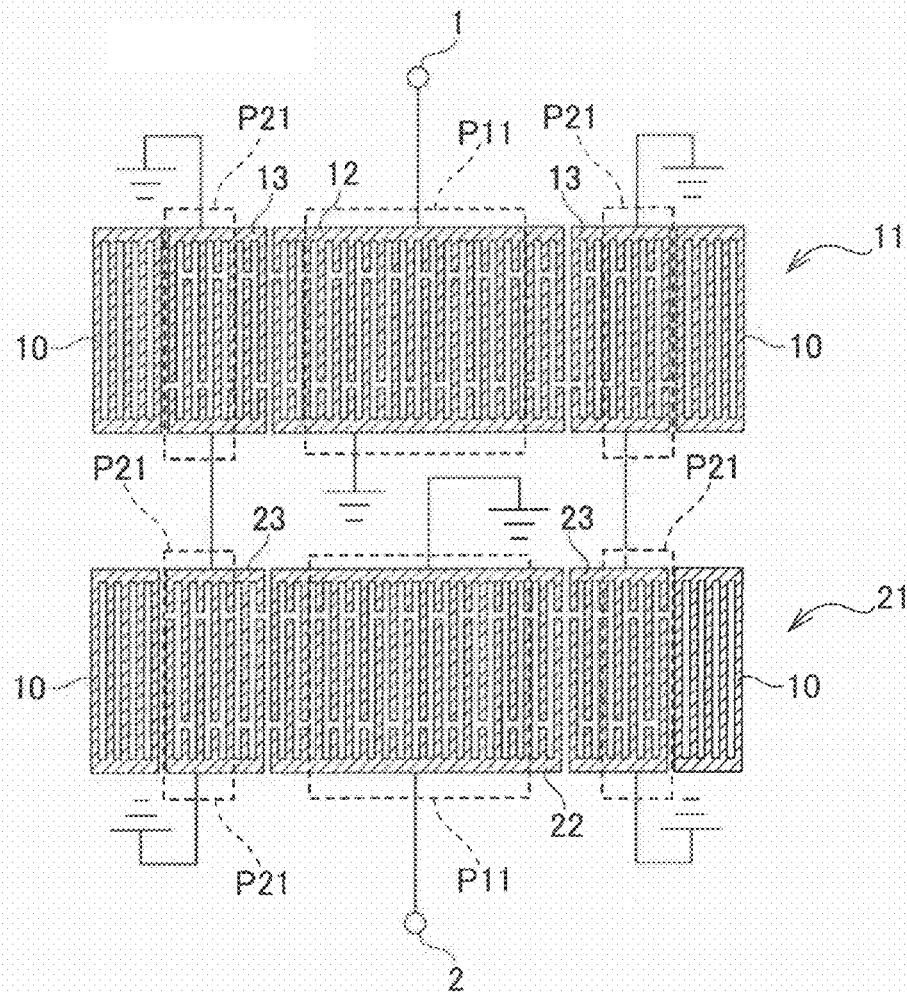
FIG. 22 is a conceptual diagram schematically showing a first example of a conventional type of longitudinally coupled resonator-type surface acoustic wave filter.

FIG. 22 is a diagram schematically showing an example of the conventional type of longitudinally coupled resonator-type surface acoustic wave filter (hereinafter referred to as a "first conventional example"). As shown in FIG. 22, the surface acoustic wave filter in the first conventional example is composed of two longitudinally coupled multi-mode type 3-IDT surface acoustic wave filters, which are cascade-connected into two stages. One of the two longitudinally coupled multi-mode type 3-IDT surface acoustic wave filters includes: one IDT 12 and two IDTs 13 provided on a piezoelectric substrate in a way that the three IDTs are arranged in a propagation direction of the surface acoustic wave; and reflectors 10 provided respectively at the two ends of the group consisting of the three IDTs. The other of the two longitudinally coupled multi-mode type surface acoustic wave filters includes: one IDT 22 and two IDTs 23 provided on a piezoelectric substrate in a way that the three IDTs are arranged in a propagation direction of the surface acoustic wave; and reflectors 10 provided respectively at the two ends of the group consisting of the three IDTs. The IDT 12 located in the center of a first filter 11 is connected to an input terminal 1, and the IDT 22 located in the center of a second filter 21 is connected to an output terminal 2. Each of the IDTs 12 and 22 will be hereinafter referred to as "center IDT." The IDTs 13 arranged at the two sides of the center IDT 12 in the first filter 11 are electrically connected to the IDTs 23 arranged at the two sides of the center IDT 22 in the second filter 21, respectively. Each of the IDTs 13 and 23 will be hereinafter referred to as "outside IDT."

Figure 23:
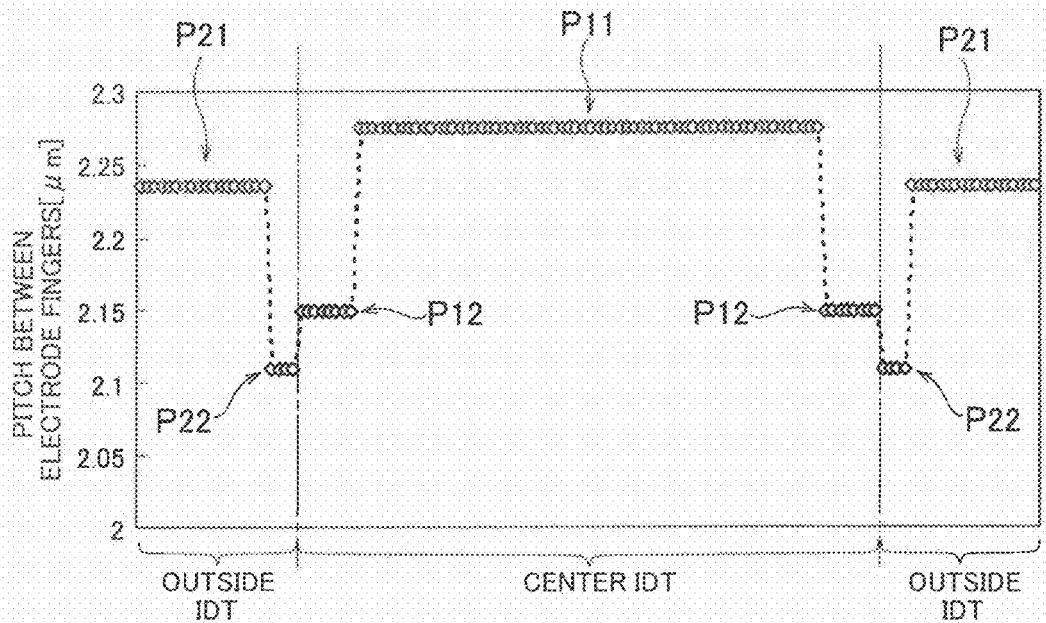
FIG. 23 is a diagram showing a pitch between electrode fingers in each of IDTs in the first example of the conventional type of longitudinally coupled resonator-type surface acoustic wave filter.

FIG. 23 is a diagram showing a pitch between electrode fingers in each of the IDTs 12 and 13 in the first filter 11 in the first conventional example, and a pitch between electrode fingers in each of the IDTs 22 and 23 in the second filter 21 in the first conventional example. As shown in FIG. 23, each of the center IDTs 12, 22 and the outside IDTs 13, 23 has its own primary pitch area P11, P21 in which the pitch between the electrode fingers is constant, and has narrower pitch areas P12 (four electrode finger pairs), P22 (two electrode finger pairs) in its each end portion of the side adjacent to other IDT (both end portions in each of the center IDTs 12, 22; end portion of the side adjacent to the center IDT 12 in the outside IDT 13; end portion of the side adjacent to the center IDT 22 in the outside IDT 23). In each narrower pitch area P12, P22, each pitch between the electrode fingers is made narrower than the pitch in each primary pitch area P11, P21, respectively. Incidentally, it is assumed that this longitudinally coupled resonator-type surface acoustic wave filter is used as a CDMA receive filter with a band of 800 MHz (with a center frequency of 881.5 MHz). This longitudinally coupled resonator-type surface acoustic wave filter has 32 pairs of electrode fingers in each of the center IDTs 12 and 22 as well as 9 pairs of electrode fingers in each of the outside IDTs 13 and 23.

Figure 26A:
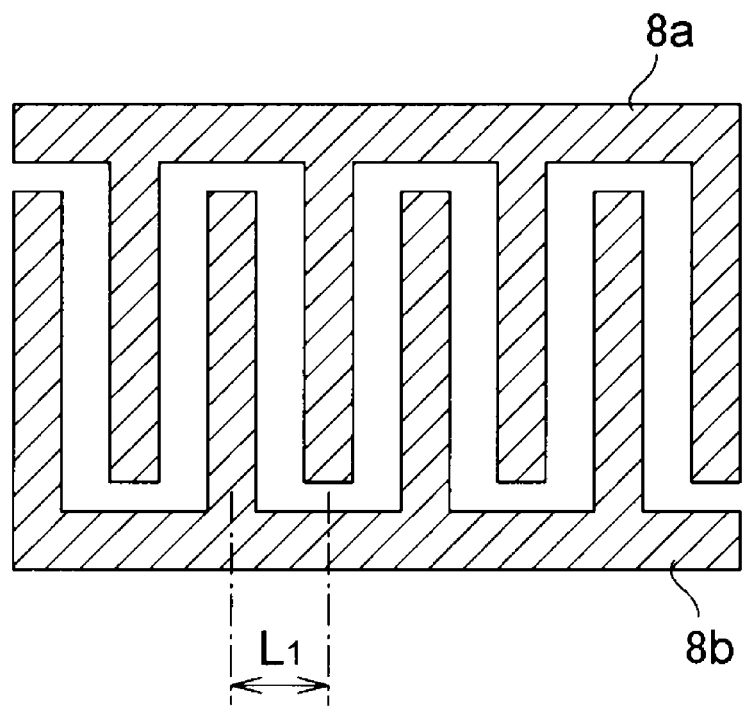
FIG. 26A is a diagram showing a pitch between electrode fingers which is common among the IDTs.
Figure 26B:
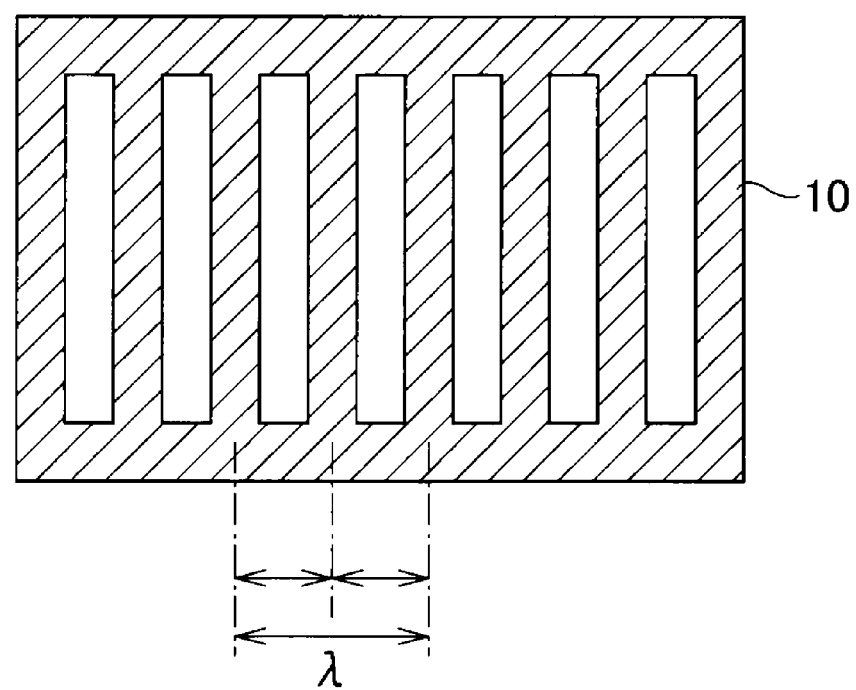
FIG. 26B is a diagram showing a pitch between electrodes which is common among the reflectors.

As shown in FIG. 26A, each of the IDTs is composed of paired comb-shaped electrodes 8a and 8b, which are opposite to each other. In this description, the pitch between electrode fingers in an IDT means the distance $L_1$ between the centers of each paired electrode fingers of the interdigitated comb-shaped electrodes 8a and 8b. In the present invention, this distance $L_1$ is changed variously in order that no IDT can have the primary pitch area. On the other hand, the distance between each two neighboring IDTs and the width with which the electrode fingers are interdigitated (in other words, overlap length (length of overlap zone of electrodes) in each of the IDTs are defined by using, λ as a reference, where λ (λ is constant) is twice as large as the distance between the centers of each two neighboring electrode fingers in each reflector 10 as shown in FIG. 26B.

Figure 24:
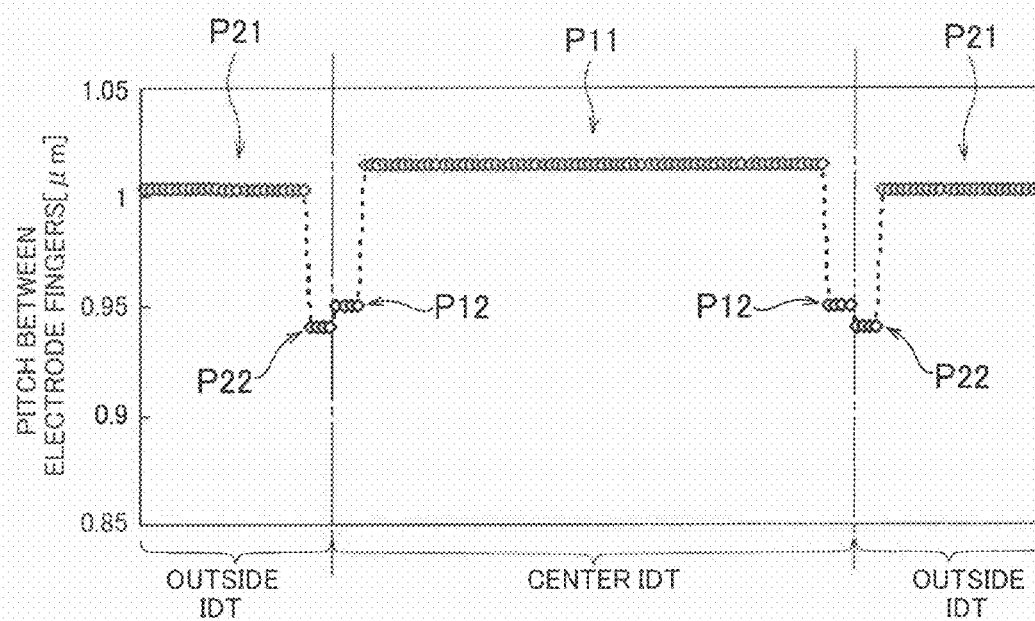
FIG. 24 is a diagram showing a pitch between electrode fingers in each of IDT in a second example of the conventional type of longitudinally coupled resonator-type surface acoustic wave filter.

FIG. 24 is a diagram showing a pitch between electrode fingers in another example of the conventional type of longitudinally coupled resonator-type surface acoustic wave filter (hereinafter referred to as a "second conventional example"). In the same manner as the longitudinally coupled multi-mode type surface acoustic wave filter (see FIG. 22) as the first conventional example, the longitudinally coupled resonator-type surface acoustic wave filter in the second conventional example includes: the primary pitch area P1, P21 in each of the IDTs 12, 13, 22, 23; and the narrower pitch area P12, P22 (two electrode finger pairs respectively) in each end portion of the IDTs 12, 13, 22, 23. However, the filter in the second conventional example has 31 pairs of electrode fingers in each of the center IDTs 12 and 22 as well as 12.5 pairs of electrode fingers in each of the outside IDTs 13 and 23. Incidentally, it is assumed that the filter in the second conventional example is used as a SAW filter for PCS.

First Embodiment

Figure 1:
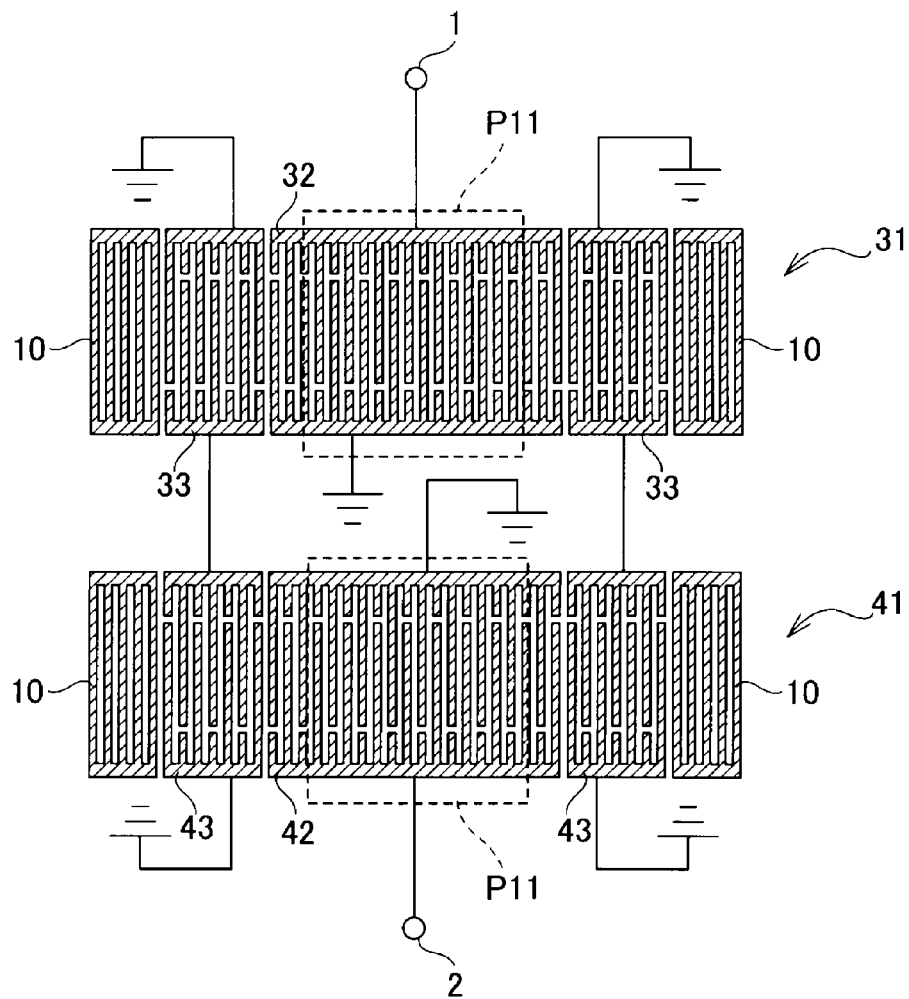
FIG. 1 is a conceptual diagram schematically showing a longitudinally coupled resonator-type surface acoustic wave filter according to a first embodiment of the present invention.

FIG. 1 is a diagram schematically showing a longitudinally coupled resonator-type surface acoustic wave filter according to a first embodiment of the present invention. In the same manner as the surface acoustic wave filters as the first and second conventional examples, the surface acoustic wave filter according to the first embodiment is composed of two longitudinally coupled multi-mode type 3-IDT surface acoustic wave filters, which are connected to each other. One of the two longitudinally coupled multi-mode type 3-IDT surface acoustic wave filters includes one IDT 32 and two IDTs 33 interposed between two reflectors 10, and the IDTs 32 and 33 are arranged in a propagation direction of the surface acoustic wave. The other of the two longitudinally coupled multi-mode type 3-IDT surface acoustic wave filters includes one IDT 42 and two IDTs 43 interposed between two reflectors 10, and the IDTs 42 and 43 are arranged in a propagation direction of the surface acoustic wave. The first filter 31 has its primary pitch area P11 in the center IDT 32, and the second filter 41 has its primary pitch area P11 in the center IDT 42. The first filter 31 has its narrower pitch areas P12 respectively in the two ends of the center IDT 32. The second filter 41 has its narrower pitch areas P12 respectively in the two ends of the center IDT 42. The pitch between the electrode fingers in each of the narrower pitch areas P12 is made narrower than the pitch between the electrode fingers in each of the primary pitch areas P11.

Figure 2:
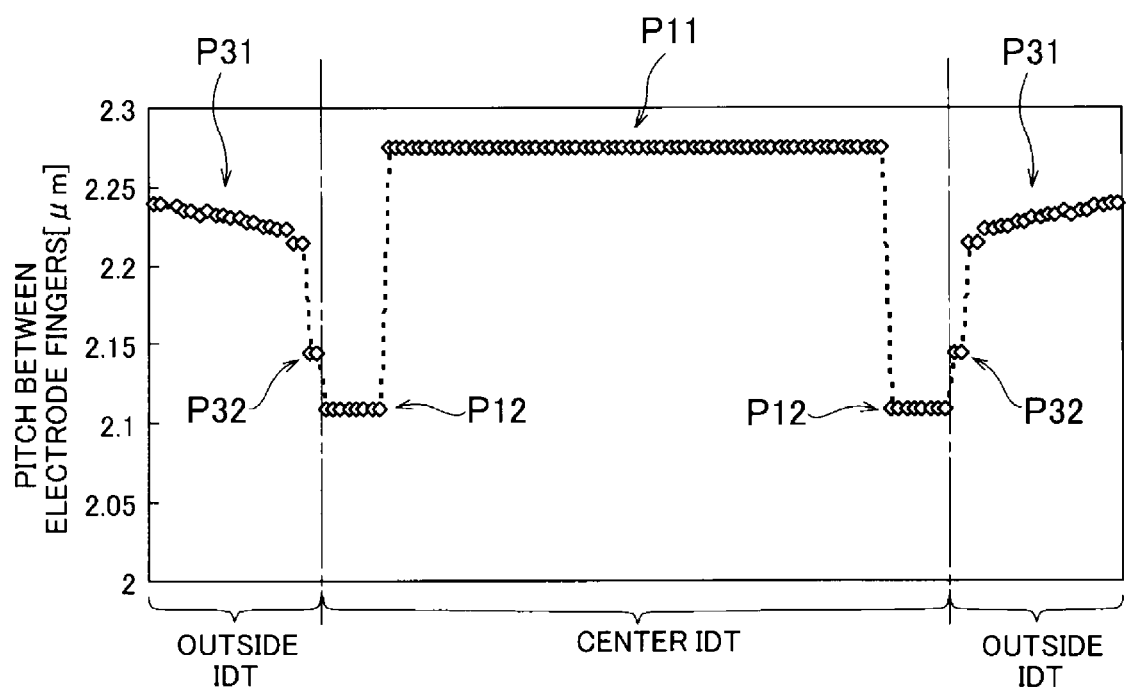
FIG. 2 is a diagram showing a pitch between electrode fingers in each of IDTs in the surface acoustic wave filter according to the first embodiment.

In this filter, however, as shown in FIG. 2, the pitch between the electrode fingers is made progressively small from the outside (the side closer to the reflector) to the inside (the side closer to the center IDT) almost throughout the entire width in each of the outside IDTs 33 and 43 (that is, the pitch between almost all of the electrode fingers is made progressively small in each of the IDTs 33 and 43). This causes each of the outside IDTs 33 and 43 to have no primary pitch area (constant pitch area). In addition, as clear from FIG. 2, the pitch between the electrode fingers in the outermost portion of each of the outside IDTs 33 and 43, which is the largest pitch between the electrode fingers in each of the IDTs 33 and 43, is smaller than the largest pitch between the electrode fingers (or the pitch in the primary pitch area P11) in each of the center IDTs 32 and 42. The pitch between the electrode fingers in the innermost pitch area P32 of each of the outside IDTs 33 and 43, which is the smallest pitch between the electrode fingers in each of the IDTs 33 and 43, is larger than the pitch between the electrode fingers in the narrower pitch area P12 in each of the two end portions of each of the center IDTs 32 and 42, which pitch is the smallest pitch (narrowest pitch) between the electrode fingers in the center IDTs 32 and 42.

Furthermore, it is assumed that, in the same manner as the filter in the first conventional example, the filter according to the present embodiment is used as a CDMA receive filter with a band of 800 MHz (with a center frequency of 881.5 MHz). The first filter 31 has 40 pairs of electrode fingers in its center IDT 32, and the second filter 41 has 40 pairs of electrode fingers in its center IDT 42. The first filter 31 has 11 pairs of electrode fingers in each of its outside IDTs 33, and the second filter 41 has 11 pairs of electrode fingers in each of its outside IDTs 43. Moreover, the number of electrode fingers in each reflector 10 is 50, and λ which is twice as large as the pitch between the electrodes in each reflector 10 is 4.56 μm (the pitch between the electrode fingers in each reflector: λ/2=2.28 μm). In addition, the overlap length (the width with which the electrode fingers are interdigitated) in each of the IDTs 32, 33, 42 and 43 is 30λ; the distance between the IDT 32 and each of the IDTs 33 as well as the distance between the IDT 42 and each of the IDTs 43 is 0.467λ; and the distance between each IDT 33 and its corresponding reflector 10 is 0.5λ.

The IDTs 32, 33, 42, 43 and the reflectors 10 are made by forming a TiN base film, for example, with a thickness of 4 nm on a top surface of a 39-degree Y-cut X-propagation LiTaO$_3$ substrate, subsequently forming a single-crystal Al film, for example, with a thickness of 330 nm on the resultant substrate, and thereby forming an electrode pattern for each of the IDTs and the reflectors. Actually, these electrode patterns are formed in numbers on a piezoelectric substrate of the foregoing type at a time, and are subsequently divided by dicing into discrete filter chips. Each chip filter is mounted on a ceramic base substrate by flip chip bonding, and is sealed with a resin. In addition, the input and output terminals 1 and 2 are unbalanced terminals, and the input/output impedance is 50Ω.

Figure 3:
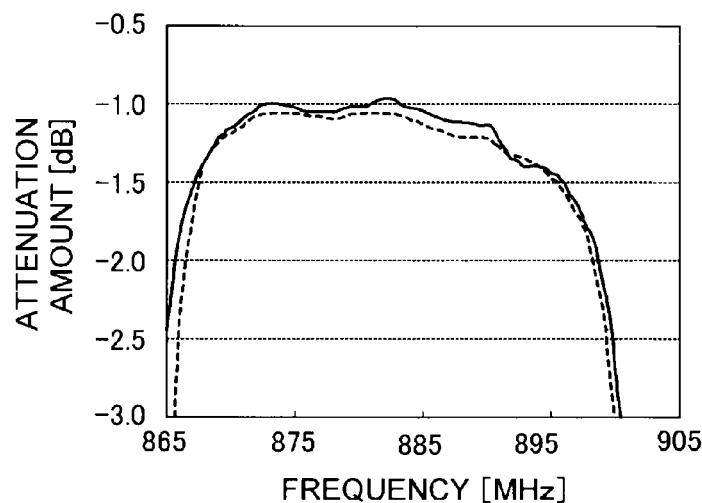
FIG. 3 is a diagram showing pass-band characteristics of the surface acoustic wave filter according to the first embodiment.
Figure 4:
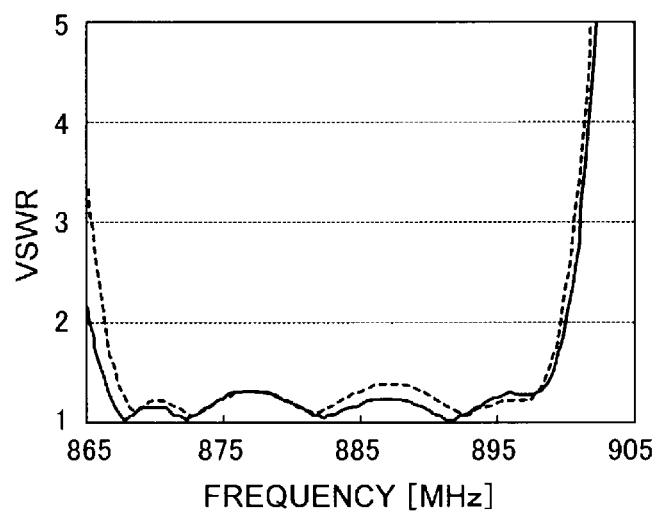
FIG. 4 is a diagram showing reflection characteristics of the surface acoustic wave filter according to the first embodiment.
Figure 5:
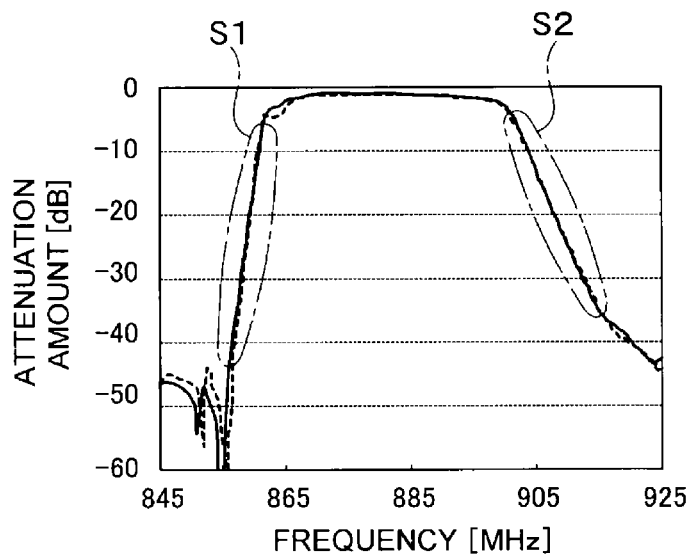
FIG. 5 is another diagram showing pass-band characteristics of the surface acoustic wave filter according to the first embodiment.

A sample of the surface acoustic wave filter according to the present embodiment was made in the foregoing manner, and the filter in the first conventional example was made of the same materials as the sample was made. Subsequently, the frequency characteristics respectively of propagation and reflectance were measured for each of the sample of the filter according to the present embodiment and the filter in the first conventional example. The results of the measurements are shown in FIGS. 3 to 5. In FIGS. 3 to 5, the solid line indicates the results of the measurements for the sample of the filter according to the present embodiment, and the broken line indicates the results of the measurements for the filter in the first conventional example (This is the case with FIGS. 7, 8, 11, 12, 14, 15, 18 and 19 which will be used when the other embodiments are described). As clear from there figures, the present embodiment makes it possible to reduce the insertion loss in the pass band of the surface acoustic wave filter (see FIG. 3), and to make the reflection characteristics thereof equal to, or better than, the reflection characteristics of the filter in the first conventional example (see FIG. 4).

The present embodiment eliminates the primary pitch area from each of the outside IDTs 33 and 43. As a result, it is unnecessary that, unlike the filter in the first conventional example, the pitch continuity between the center IDT 32 and each of the outside IDTs 33 as well as the pitch continuity between the center IDT 42 and each of the outside IDTs 43 should be maintained by use of the narrower pitch areas P22 only. Thus, it is presumed that the surface acoustic wave filter according to the present embodiment is capable of suppressing the increase of the insertion loss caused by the bulk wave radiation. Here, the bulk wave radiation occurs due to the pitch discontinuity between the center IDT 32 and each of the outside IDTs 33 and the discontinuity between the center IDT 42 and each of the outside IDTs 43. Furthermore, the filter according to the present embodiment and the filter in the first conventional example have similar pass-band characteristics in each of the two shoulder portions S1 and S2 (see FIG. 5) of the pass band. It is learned that the filter using the pitch configuration according to the present embodiment does not deteriorate the pass-band characteristics in comparison with the filter in the first conventional example.

Second Embodiment

Figure 6:
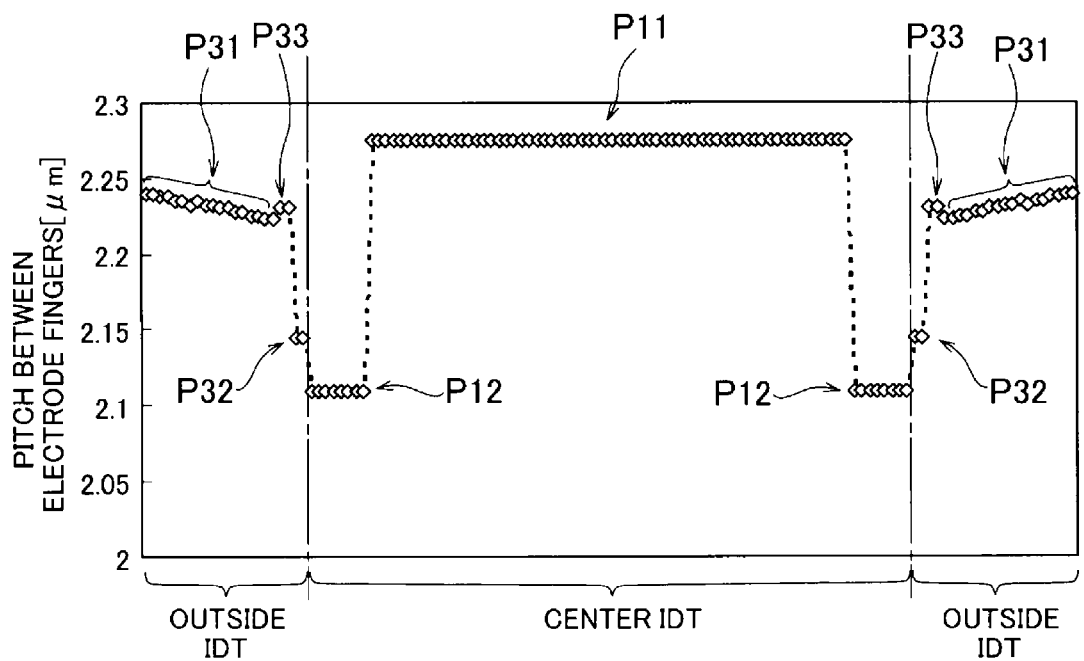
FIG. 6 is a diagram showing a pitch between electrode fingers in each of IDTs in a longitudinally coupled resonator-type surface acoustic wave filter according to a second embodiment of the present invention.

FIG. 6 is a diagram showing a pitch between electrode fingers in each of IDTs in a longitudinally coupled resonator-type surface acoustic wave filter according to a second embodiment of the present invention. In the same manner as the filter according to the first embodiment (see FIG. 1), the filter according to the second embodiment is composed of two longitudinally coupled multi-mode type 3-IDT surface acoustic wave filters, which are connected between an unbalanced input terminal 1 and an unbalanced output terminal 2. One of the two longitudinally coupled multi-mode type 3-IDT surface acoustic wave filters includes one center IDT 32 and two outside IDTs 33 arranged between a pair of reflectors 10. The other of the two longitudinally coupled multi-mode type 3-IDT surface acoustic wave filters includes one center IDT 42 and two outside IDTs 43 arranged between a pair of reflectors 10. However, the pitch between the electrode fingers in each of the outside IDTs 33 and 43 in the filter according to the second embodiment is not changed in a monotonous manner, unlike the pitch between the electrode fingers in each of the outside IDTs 33 and 43 in the filter according to the first embodiment which includes no primary pitch area (see FIG. 2).

In the filter according to the first embodiment (see FIG. 2), the pitch between the electrode fingers in each of the outside IDTs 33 is made simply smaller from the outside (one side adjacent to a corresponding one of the reflectors 10) to the inside (the other side adjacent to the center IDT 32), and the pitch between the electrode fingers in each of the outside IDTs 43 is made simply smaller from the outside (one side adjacent to a corresponding one of the reflectors 10) to the inside (the other side adjacent to the center IDT 42), in a way that the pitches include no primary pitch area. Unlike each of the outside IDTs 33 and 43 in the filter according to the first embodiment, specifically, each of the outside IDTs 33 and 43 in the filter according to the second embodiment has a pitch between the electrode fingers which is made progressively small from the outside to the inside in a pitch area P31, and which is slightly increased reversely (see reference numeral P33 in FIG. 6) and then made small again (see reference numeral P32 in FIG. 6) in an inner area adjacent to a corresponding one of the center IDTs 32 and 42. Incidentally, the filter according to the second embodiment is similar to the filter according to the first embodiment in that the largest pitch between the electrode fingers in each of the outside IDTs 33 and 43 is smaller than the largest pitch between the electrode fingers in each of the center IDTs 32 and 42, and in that the smallest pitch P32 between the electrode fingers in each of the outside IDTs 33 and 43 is larger than the smallest pitch P12 between the electrode fingers in each of the center IDTs 32 and 42.

Figure 7:
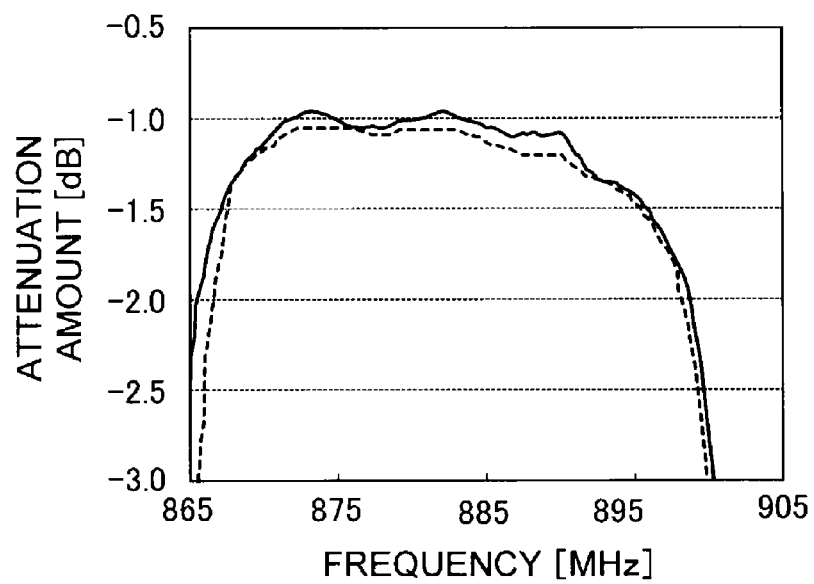
FIG. 7 is a diagram showing pass-band characteristics of the surface acoustic wave filter according to the second embodiment.
Figure 8:
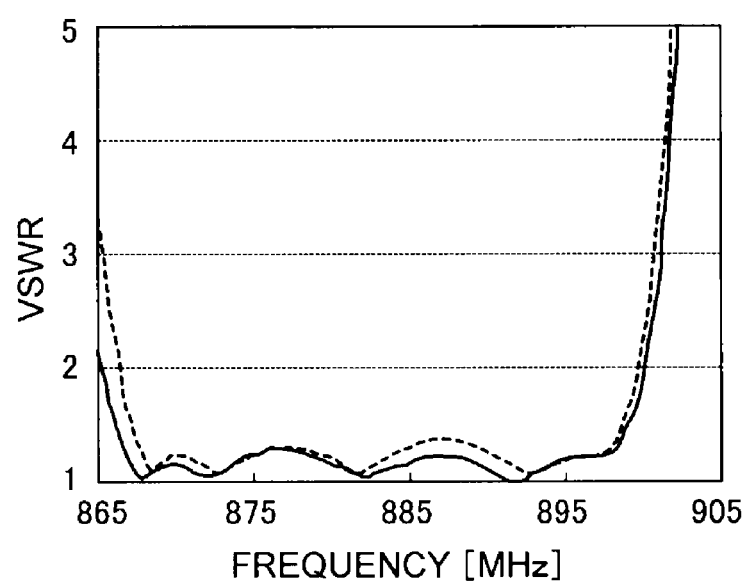
FIG. 8 is a diagram showing reflection characteristics of the surface acoustic wave filter according to the second embodiment.

The non-monotonous change (not only increasing or decreasing change) in the pitch between the electrode fingers in the present embodiment is a scheme which was discovered while the inventors variously examined the present invention. The inventors found that the non-monotonous change (not only increasing or decreasing change) in the pitch between the electrode fingers in each of the IDTs designed to have no primary pitch area made it possible not only to reduce the insertion loss of the surface acoustic wave filter, but also to improve the reflection characteristics thereof. FIGS. 7 and 8 are diagrams showing results of measuring the pass-band and reflection characteristics of the filter according to the present embodiment, respectively, by comparing the characteristics with those of the filter according to the first embodiment in the same manner as those of the filter according to the first embodiment are compared with those of the filter in the first conventional example. As clear from the results of these measurements, the second embodiment further reduces the insertion loss of the surface acoustic wave filter, and further improves the reflection characteristics thereof.

Third Embodiment

Figure 9:
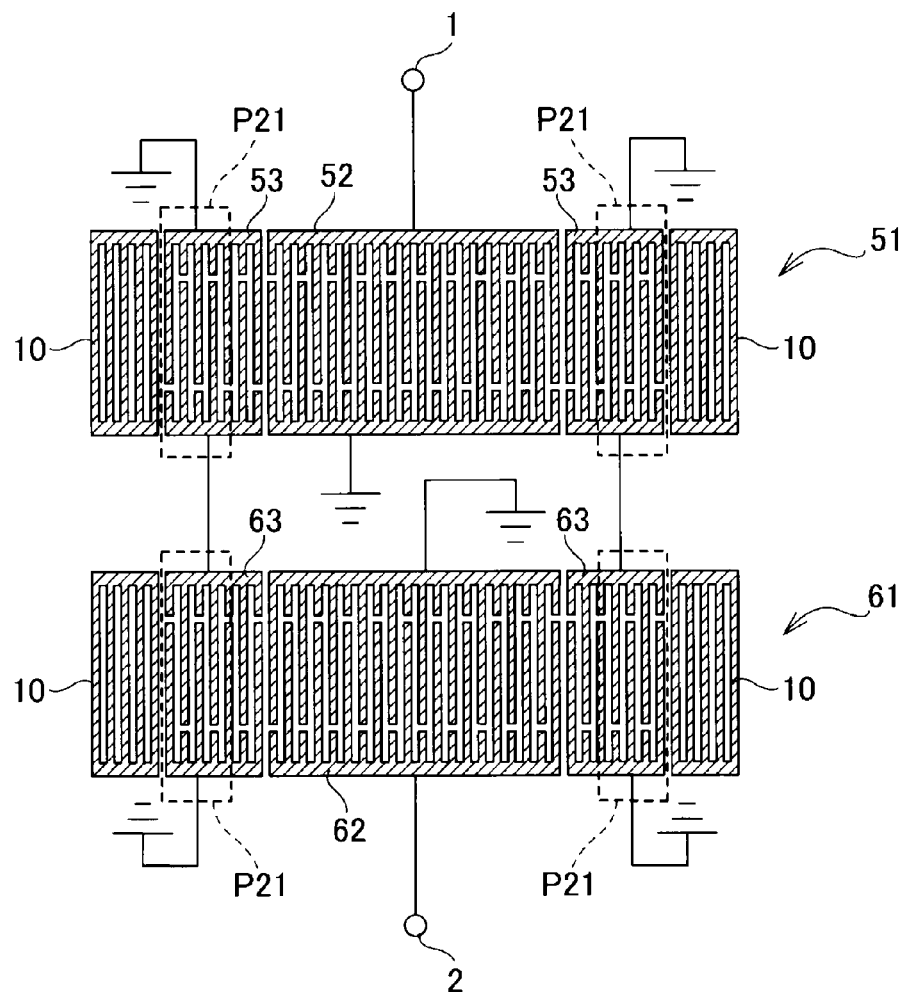
FIG. 9 is a conceptual diagram schematically showing a longitudinally coupled resonator-type surface acoustic wave filter according to a third embodiment of the present invention.
Figure 10:
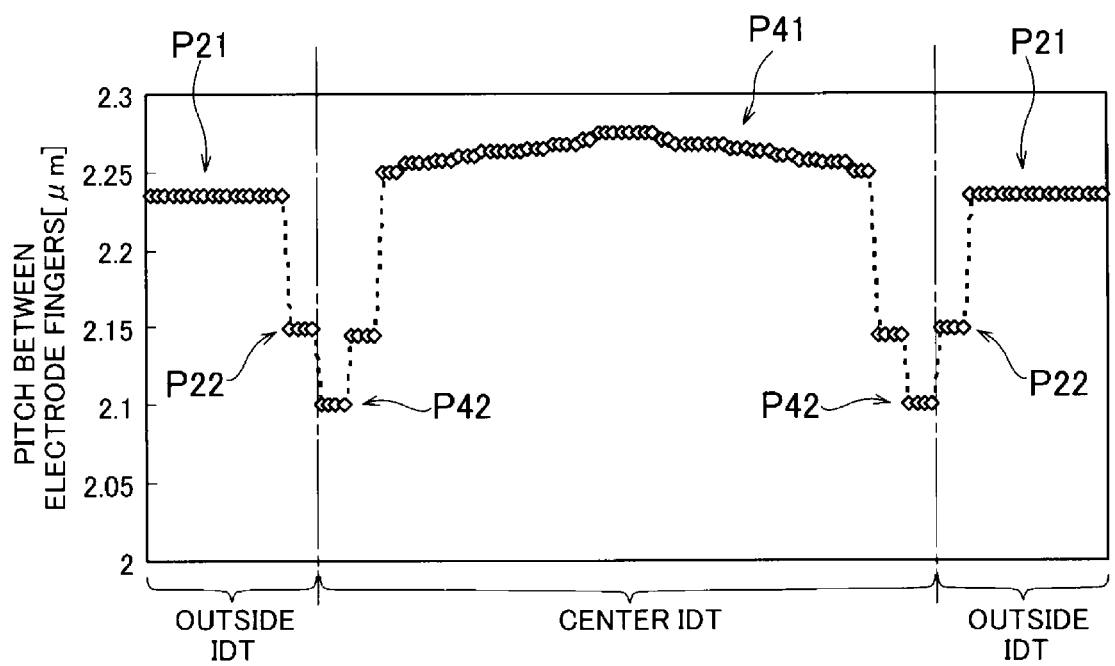
FIG. 10 is a diagram showing a pitch between electrode fingers in each of IDTs in the longitudinally coupled resonator-type surface acoustic wave filter according to the third embodiment.

FIG. 9 is a diagram schematically showing a longitudinally coupled resonator-type surface acoustic wave filter according to a third embodiment of the present invention. FIG. 10 is a diagram showing a pitch between electrode fingers in each of IDTs in the longitudinally coupled resonator-type surface acoustic wave filter according to the third embodiment. In the same manner as the filters according to the first and second embodiments, as shown in FIG. 9, the longitudinally coupled resonator-type surface acoustic wave filter according to the third embodiment is composed of two longitudinally coupled multi-mode type 3-IDT filters 51 and 61, which are cascade-connected into two stages between an unbalanced input terminal 1 and an unbalanced output terminal 2. The filter 51 includes one IDT 52 (center IDT) and two IDTs (outside IDTs) 53 arranged between a pair of reflectors 10. The filter 61 includes one IDT (center IDT) 62 and two IDTs (outside IDTs) 63 arranged between a pair of reflectors 10. As shown in FIG. 10, however, no primary pitch area (constant pitch area) is provided to the center IDT 52 or 62 in the filter according to the third embodiment.

Specifically, each of the center IDTs 52 and 62 has a pitch area P41 in which the pitch between the electrode fingers is the largest in the central portion of the center IDT, and becomes progressively small toward the two end portions thereof. As a result, the curve representing pitch distribution is shaped like a mountain. The largest pitch P21 in each of the outside IDTs 53 and 63 is smaller than the largest pitch in each of the center IDTs 52 and 62. The smallest pitch P22 in each of the outside IDTs 53 and 63 is larger than the smallest pitch P42 in each of the center IDT 52 and 62. Incidentally, each of the outside IDTs 53 and 63 includes a primary pitch area P21, and has a narrower pitch area P22 in its end portion adjacent to a corresponding one of the center IDTs 52 and 62.

Figure 11:
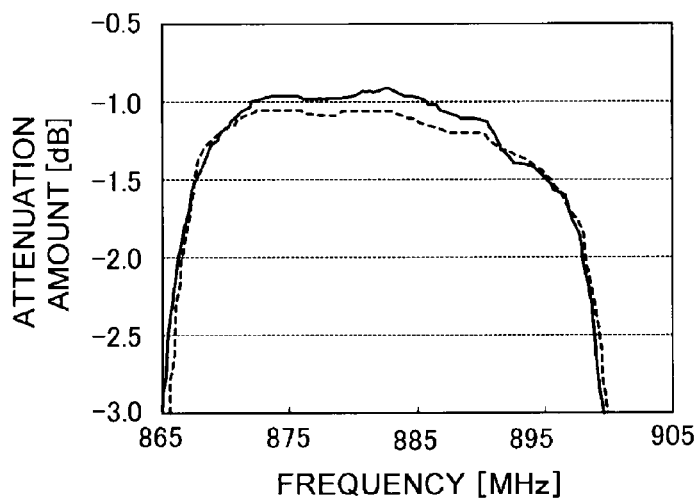
FIG. 11 is a diagram showing pass-band characteristics of the surface acoustic wave filter according to the third embodiment.
Figure 12:
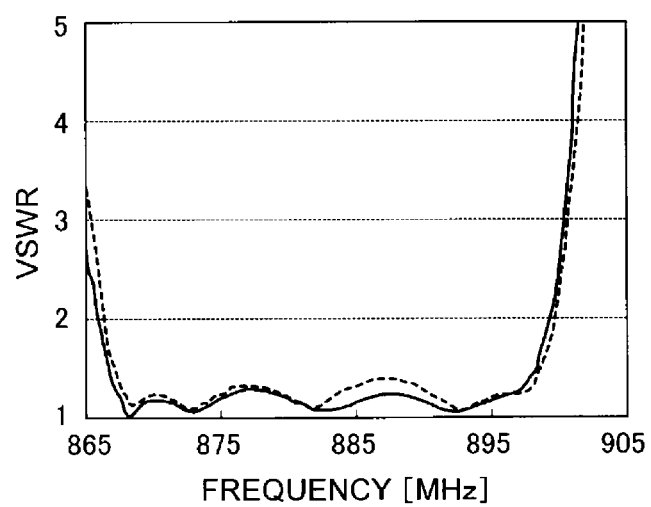
FIG. 12 is a diagram showing reflection characteristics of the surface acoustic wave filter according to the third embodiment.
Figure 13:
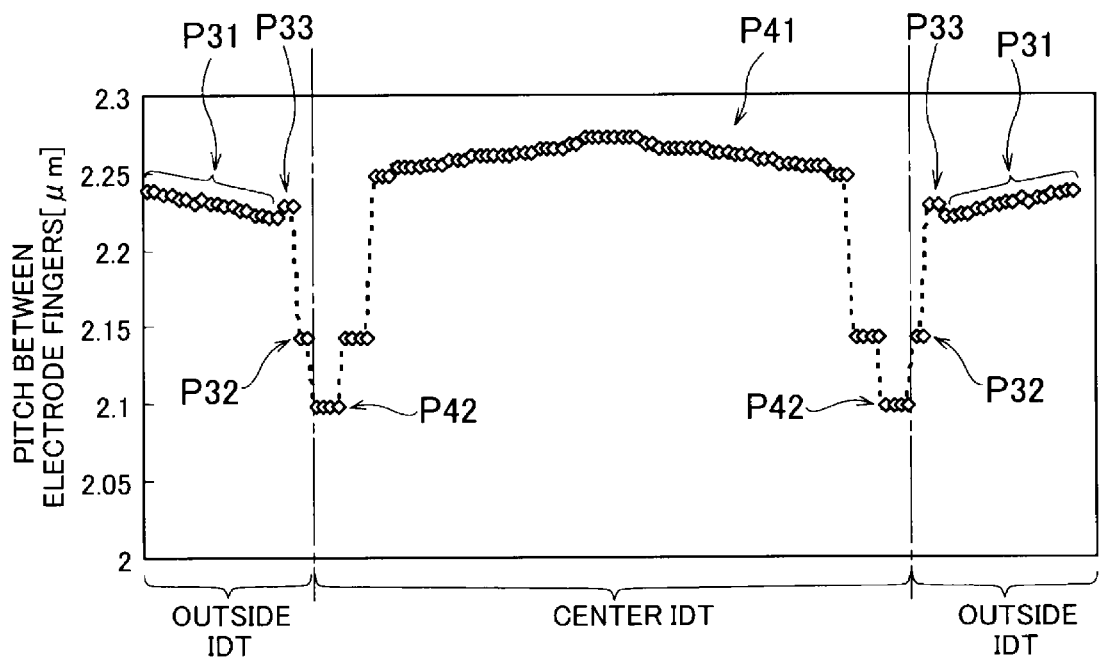
FIG. 13 is a diagram showing a pitch between electrode fingers in each of IDTs in a longitudinally coupled resonator-type surface acoustic wave filter according to a fourth embodiment of the present invention.

FIGS. 11 and 12 are diagrams showing results of measuring the pass-band and reflection characteristics of the filter according to the present embodiment, respectively. As clear from the results of these measurements, the filter configuration according to the present embodiment also makes it possible to reduce the insertion loss of the surface acoustic wave filter, and to improve the reflection characteristics thereof.

Fourth Embodiment

Figure 14:
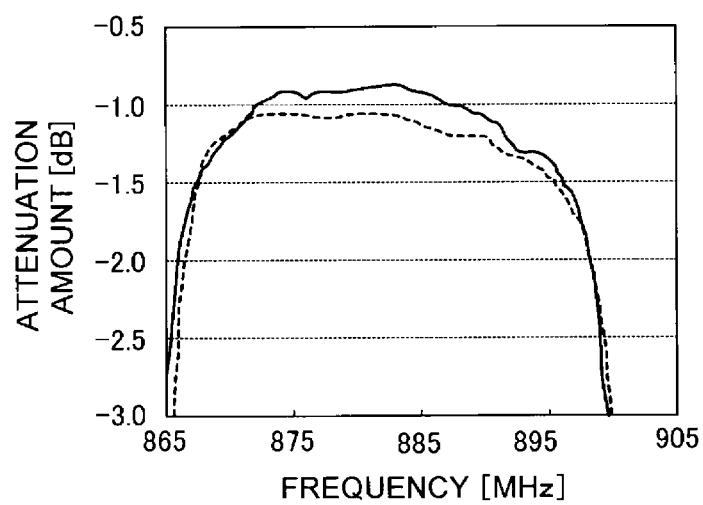
FIG. 14 is a diagram showing pass-band characteristics of the surface acoustic wave filter according to the fourth embodiment.

FIG. 14 is a diagram showing a pitch between electrode fingers in each of IDTs in a longitudinally coupled resonator-type surface acoustic wave filter according to a fourth embodiment of the present invention. In the same manner as the surface acoustic wave filter according to the third embodiment, the surface acoustic wave filter according to the fourth embodiment is composed of two longitudinally coupled multi-mode type 3-IDT filters, which are connected to each other. However, in the same manner as each of the outside IDTs in the surface acoustic wave filter according to the second embodiment (see FIG. 6), each of the two outside IDTs in each of the two longitudinally coupled multi-mode type 3-IDT filters constituting the surface acoustic wave filter according to the fourth embodiment does not have any primary pitch area and has pitch areas P31, P33 and P32 through which the pitch between the electrode fingers is changed in a non-monotonous manner. Also, in the same manner as each of the center IDTs in the filter according to the third embodiment (see FIG. 10), each of the center IDTs in the filter according to the fourth embodiment has a pitch area P41 in which the pitch between the electrode fingers is the largest in the central portion of the center IDT, and becomes progressively small toward the two end portions thereof. As a result, the curve representing pitch distribution is shaped like a mountain. These cause each of one center IDT 52 and two outside IDTs 53 in the first filter 51 to have no primary pitch area, and cause each of one center IDT 62 and two outside IDTs 63 in the second filter 61 to have no primary pitch area. Incidentally, in the filter according to the fourth embodiment, the largest pitch in each of the outside IDTs is smaller than the largest pitch in each of the center IDTs, and the smallest pitch in each of the outside IDTs is larger than the smallest pitch in each of the center IDTs.

Figure 15:
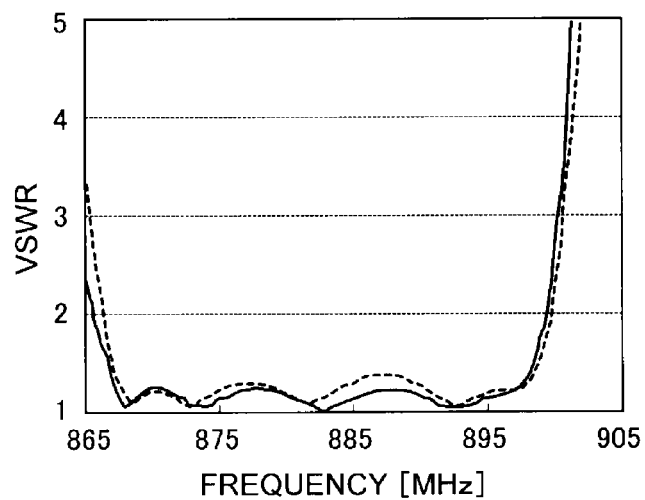
FIG. 15 is a diagram showing reflection characteristics of the surface acoustic wave filter according to the fourth embodiment.

FIGS. 14 and 15 are diagrams showing results of measuring the pass-band and reflection characteristics of the filter according to the fourth embodiment, respectively. As clear from the results of these measurements, the filter configuration according to the fourth embodiment makes it possible to reduce the insertion loss of the surface acoustic wave filter more than the filter configurations respectively of the first conventional example and the first to third embodiments, and to improve the reflection characteristics thereof more than the filter configurations.

Fifth Embodiment

Figure 17:
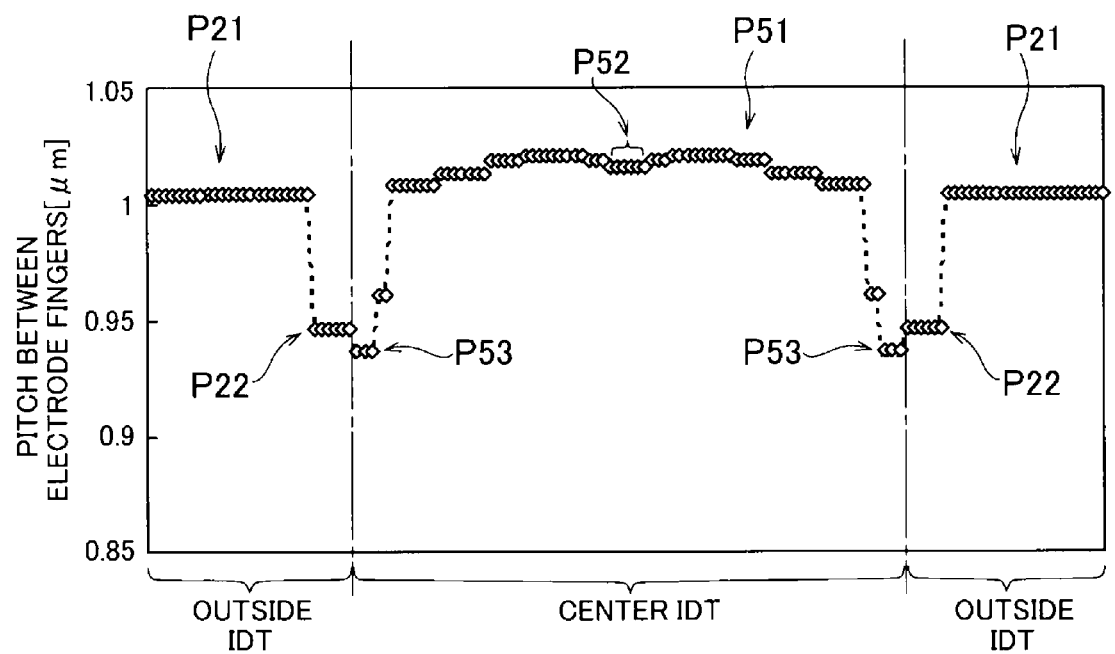
FIG. 17 is a diagram showing a pitch between electrode fingers in each of IDTs in the longitudinally coupled resonator-type surface acoustic wave filter according to the fifth embodiment.
Figure 16:
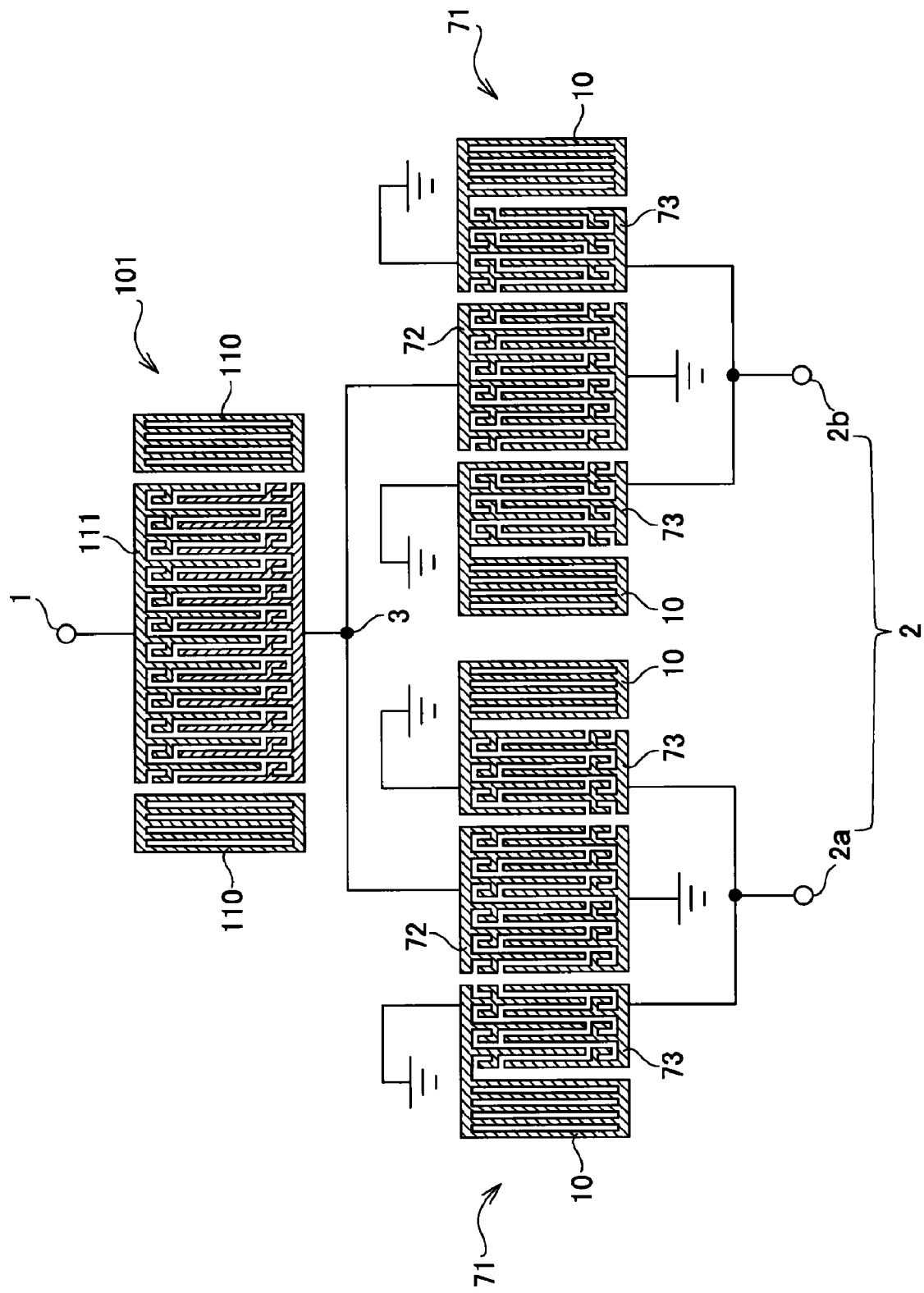
FIG. 16 is a conceptual diagram schematically showing a longitudinally coupled resonator-type surface acoustic wave filter according to a fifth embodiment of the present invention.

FIG. 16 is a diagram schematically showing a longitudinally coupled resonator-type surface acoustic wave filter according to a fifth embodiment of the present invention. FIG. 17 is a diagram showing a pitch between electrode fingers in each of IDTs in the filter according to the fifth embodiment. As shown in FIG. 16, the surface acoustic wave filter according to the fifth embodiment is composed of two longitudinally coupled multi-mode type filters 71 and a surface acoustic wave resonator 101. The phase of a signal outputted from one of the two longitudinally coupled multi-mode type filters 71 is shifted from the phase of a signal outputted from the other of the two filters 71 by substantially 180 degrees. The two filters 71 are electrically connected to each other in parallel. The surface acoustic wave resonator 101 is inserted (or connected in series) between an input terminal 1 and an unbalanced terminal drawn out from a connecting point 3 at which the two filters 71 are electrically connected to each other in parallel.

Each of the multi-mode type filters 71 connected to each other in parallel includes one IDT 72 and two IDTs 73 arranged between a pair of reflectors 10. As shown in FIG. 17, each of the outside IDTs 73 has a primary pitch area P21, and has a narrower pitch area P22 in its inner portion adjacent to a corresponding one of the center IDTs 72. In contrast, each of the center IDTs 72 is designed to have no primary pitch area by changing pitches each between two to 7 electrode fingers stepwise one after another throughout the center IDT. In addition, the pitches each between the two to seven electrode fingers are changed in a non-monotonous manner (not only increasing or decreasing change) in each of the center IDTs 72.

Specifically, in each of the center IDTs, the pitches each between the two to seven electrode fingers are increased gradually (stepwise) toward the center of the IDT from one end portion of the IDT, and are decreased in a central portion of the IDT (shown by reference numeral P52 in FIG. 17). Thereafter, the pitches are increased once again, and are decreased toward the other end portion of the IDT. As a result, the curve representing pitch distribution undulates. In other words, the filter according to the fifth embodiment has the pitches each between the two to seven electrode fingers which are changed throughout each of the center IDTs in a way that the curve representing the pitch distribution is shaped almost like a mountain while having the pitch area P52 in which the pitches each between the two to seven electrode fingers are decreased in way that the curve representing the pitch distribution is concave, unlike the filter according to the third embodiment having the pitch between the electrode fingers which is changed so that the pitch is the largest in the central portion of each of the center IDTs and the pitch becomes progressively small toward the two end portions of the center IDT in a way that the curve representing the pitch distribution is relatively simply shaped like a mountain. Incidentally, in the filter according to the fifth embodiment, the largest pitch P21 in each of the outside IDTs 73 is smaller than the largest pitch in each of the center IDTs 72, and the smallest pitch P22 in each of the outside IDTs 73 is larger than the smallest pitch P53 in each of the center IDTs 72.

It is assumed that the filter according to the fifth embodiment is used as a PCS receive filter (with a center frequency of 1960 MHz). Each of the filters 71 connected to each other in parallel has 39.0 pairs of electrode fingers in its center IDT 72 and 14.5 pairs of electrode fingers in each of its outside IDTs 73 as well as 65 electrodes in each of the reflectors 10. Then, $\lambda$ which is twice as large as the pitch between the electrode fingers in each of the reflectors 10 is 2.01 µm. In addition, the overlap length in each of the IDTs 72 and 73 is 40$\lambda$; the distance between the IDT 72 and each of the IDTs 73 is 0.468$\lambda$; and the distance between each IDT 73 and its corresponding reflector 10 is 0.5$\lambda$.

Furthermore, the IDT 72, the IDTs 73 and the reflectors 10 are made by forming a TiN base film, for example, with a thickness of 4 nm on a top surface of a 46-degree Y-cut X-propagation LiTaO$_3$ substrate, subsequently forming a single-crystal Al film, for example, with a thickness of 170 nm on the resultant substrate, and thereby forming an electrode pattern for each of the IDTs and the reflectors. In the same manner as the electrode patterns for the filter according to the first embodiment, these electrode patterns for the filter according to the fifth embodiment are formed in numbers on a piezoelectric substrate of the foregoing type at a time, and are subsequently divided by dicing into discrete filter chips. Each chip filter is mounted on a ceramic base substrate by flip chip bonding, and is sealed with a resin. In addition, the input terminal 1 is an unbalanced terminal with an input impedance of 50Ω. The output terminal 2 is balanced terminals 2a and 2b with an output impedance of 150Ω. An impedance-matching inductor (not illustrated) is provided between the balanced output terminals 2a and 2b.

Moreover, the surface acoustic wave resonator 101, which is connected in series to these multi-mode type filters 71, includes an IDT 111 interposed between a pair of reflectors 110. The pitch between the electrode fingers in the IDT 111 as well as $\lambda$ which is twice as large as the pitch between the electrodes in each of the reflectors 110 is 1.972 µm. The IDT 111 has 169.0 pairs of electrode fingers, and the overlap length in the IDT 111 is 30$\lambda$. The number of electrode fingers in each of the reflectors 110 is 80. The distance between the IDT 111 and each of the reflectors 110 is 0.5$\lambda$.

Figure 18:
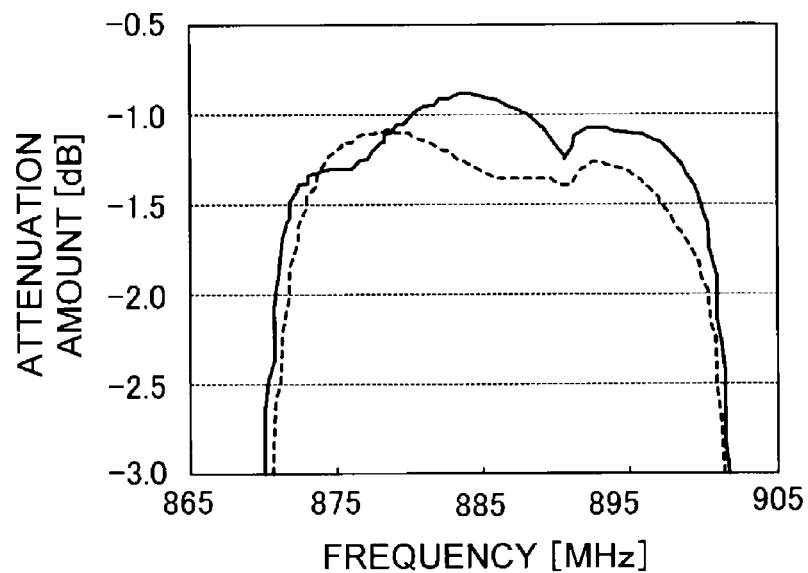
FIG. 18 is a diagram showing pass-band characteristics of the surface acoustic wave filter according to the fifth embodiment.
Figure 19:
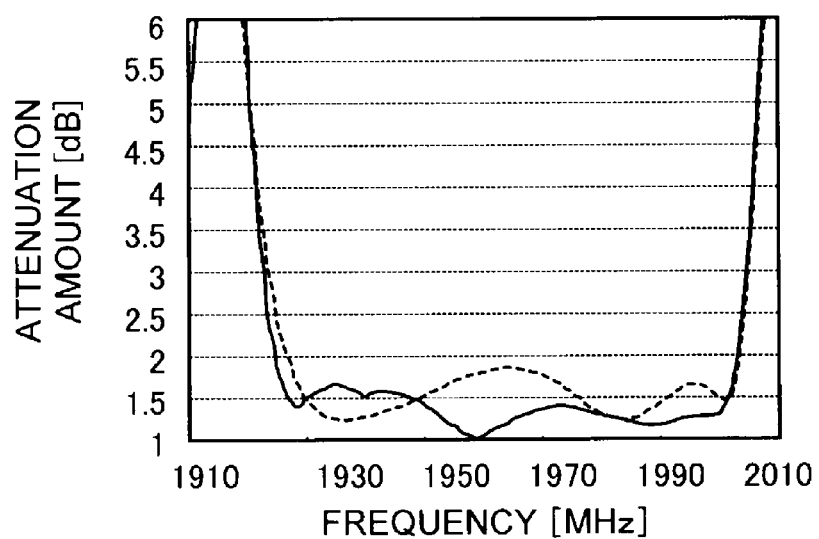
FIG. 19 is a diagram showing reflection characteristics of the surface acoustic wave filter according to the fifth embodiment.

FIGS. 18 and 19 are diagrams showing results of measuring the pass-band and reflection characteristics of the filter according to the fifth embodiment, respectively. As clear from the results of these measurements, the fifth embodiment makes it possible to reduce the insertion loss of the surface acoustic wave filter in a very favorable manner, and to obtain very favorable reflection characteristics thereof.

Figure 27:
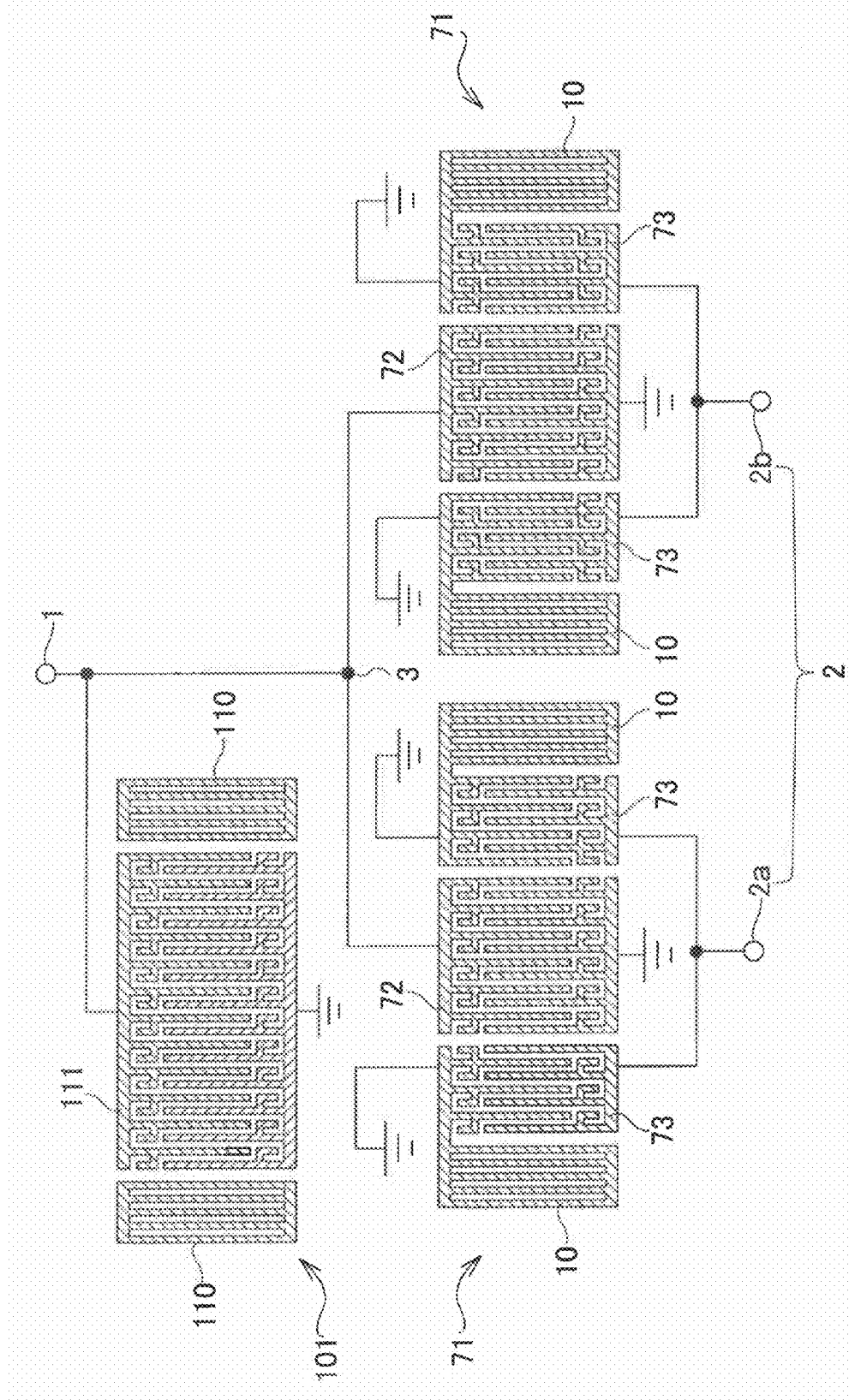
FIG. 27 is a diagram showing a resonator connected in parallel to a surface acoustic wave filter.

It should be noted that the resonator 101 may be connected to the multi-mode type filters in any other manner, and that any number of resonators 101 may be connected to the multi-mode type filters. For example, the resonator may be connected in parallel to the multi-mode type filters, as shown in FIG. 27. Otherwise, the surface acoustic wave filter according to the fifth embodiment may include a plurality of resonators connected in series to one another or a plurality of resonators connected in parallel to one another.

Sixth Embodiment

Figure 20:
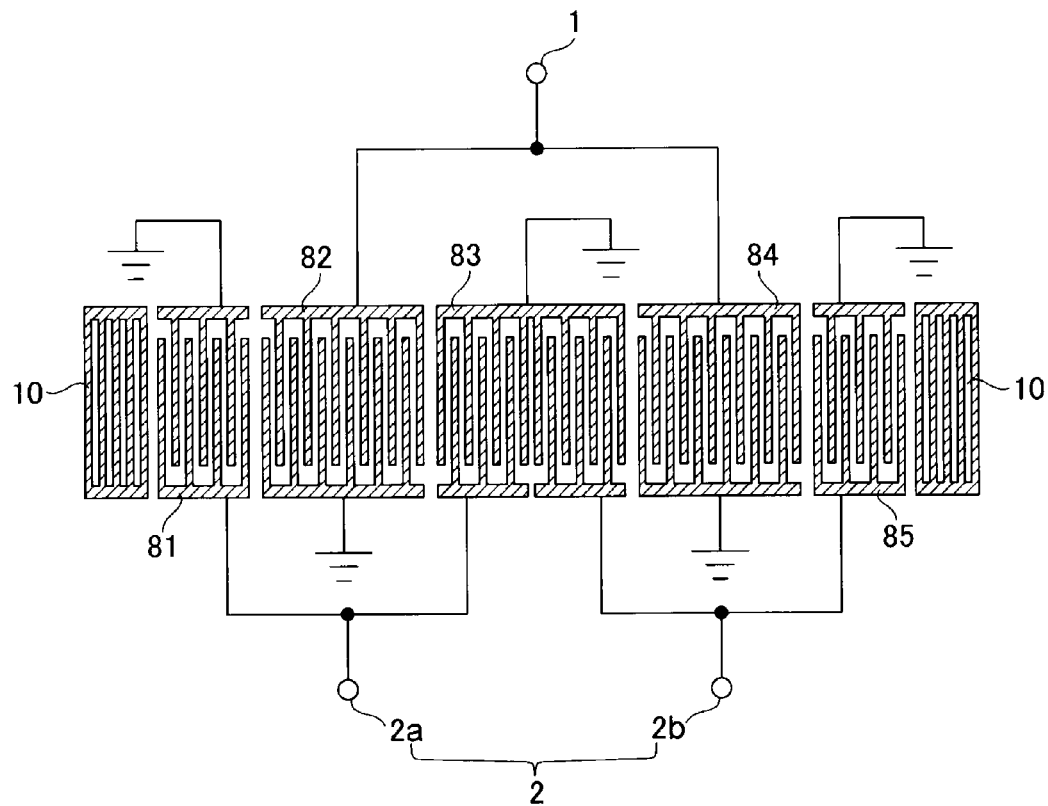
FIG. 20 is a conceptual diagram schematically showing a longitudinally coupled resonator-type surface acoustic wave filter according to a sixth embodiment of the present invention.
Figure 21:
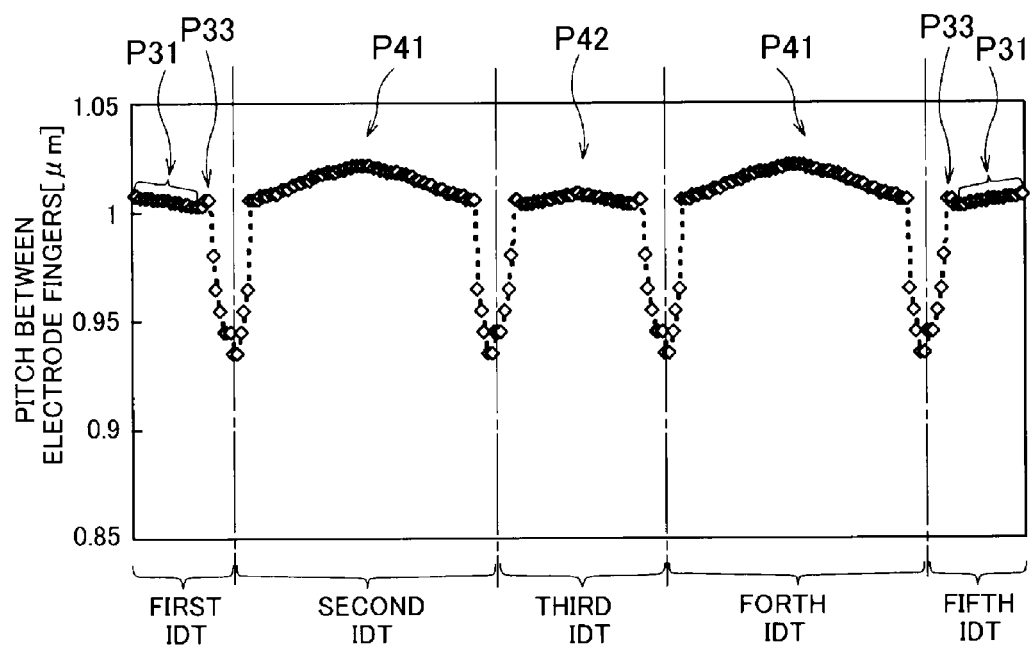
FIG. 21 is a diagram showing a pitch between electrode fingers in each of IDTs in the longitudinally coupled resonator-type surface acoustic wave filter according to the sixth embodiment.

FIG. 20 is a diagram schematically showing a longitudinally coupled resonator-type surface acoustic wave filter according to the sixth embodiment. FIG. 21 is a diagram showing a pitch between electrode fingers in each of IDTs in the filter according to the sixth embodiment. As shown in FIG. 20, the surface acoustic wave filter according to the sixth embodiment is a longitudinally coupled multi-mode type filter including five IDTs 81 to 85 between a pair of reflectors 10. The five IDTs 81 to 85 are arranged in a propagation direction of the surface acoustic wave, and are named a first IDT, a second IDT, a third IDT, a fourth IDT and a fifth IDT in order from one reflector to the other.

The pitch between the electrode fingers in each of the first to fifth IDTs 81 to 85 is changed in a way that none of the first to fifth IDTs 81 to 85 have any primary pitch area. Specifically, as shown in FIG. 21, the pitch between the electrode fingers in each of the first IDT 81 and the fifth IDT 85, which are the endmost IDTs adjacent to the respective reflectors 10, is changed in the same manner as the pitch between the electrode fingers in each of the outside IDTs in the filter according to the second embodiment (see FIG. 6). In addition, the pitch between the electrode fingers in each of the second IDT 82 and the fourth IDT 84 is changed in the same manner as the pitch between the electrode fingers in each of the center IDT in the filter according to the third embodiment (see FIG. 10).

Furthermore, the pitch between the electrode fingers is continuously changed in each end area of any IDT, which end area is adjacent to a corresponding one of the neighboring IDTs, in the filter according to the sixth embodiment, unlike the pitch between the electrode fingers which is changed stepwise in each of the IDTs in each of the filters according to the first to fifth embodiments. Nevertheless, the pitch between the electrode fingers may be changed stepwise or continuously in each end area of any IDT in each of the filters according to the first to sixth embodiments.

Moreover, the pitch between the electrode fingers is changed throughout the third IDT 83 located in the middle of the filter in a way that the curve representing pitch distribution is shaped like a mountain, while the pitch between the electrode fingers is slightly increased in each of the right and left end portions of the third IDT 83 as in the case of each of the end portions respectively of the first IDT 81 and the fifth IDT 85. The IDTs are designed in a way that the largest pitch between the electrode fingers in an IDT having the smaller number of paired electrode fingers between any two neighboring IDTs is smaller than the largest pitch between the electrode fingers in the other IDT having the larger number of paired electrode fingers between the two neighboring IDTs. Concurrently, the IDTs are designed in a way that the smallest pitch between the electrode fingers in the former IDT having the smaller number of paired electrode fingers is larger than the smallest pitch between the electrode fingers in the latter IDT having the larger number of paired electrode fingers.

The filter according to the sixth embodiment has, for example, 14.5 pairs of electrode fingers in the first IDT 81, 25.0 pairs of electrode fingers in the third IDT 83, 14.5 pairs of electrode fingers in the fifth IDT 85, and 38.0 pairs of electrode fingers in each of the second IDT 82 and the fourth IDT 84 as well as 65 pairs of electrodes in each of the reflectors 10 located respectively in the two ends. In addition, λ which is twice as large as the pitch between the electrode fingers in each of the reflectors 10 is 2.01 µm, for example. The overlap length in each of the IDTs 81 to 85 is 40λ, for example. The distance between each two neighboring IDTs is 0.468λ, for example. The distance between each of the endmost IDTs and a corresponding one of the reflectors is 0.5λ, for example.

The present invention is not limited to the embodiments which have been described on the basis of the drawings. The present invention may be modified in various ways without departing from the scope of claims.

For example, the pitch between the electrode fingers may be changed in all or parts of the IDTs constituting a filter according to the present invention in order that none of the IDTs have any primary pitch area. In addition, the stepwise change in the pitch between the electrode fingers and the continuous change in the pitch between the electrode fingers on a one-by-one basis may be used in combination in a single IDT or throughout a single filter depending on the necessity. Furthermore, input terminal and output terminal in the present invention may be a combination of a balanced input terminal and a balanced output terminal, a combination of an unbalanced input terminal and an unbalanced output terminal, a combination of a balanced input terminal and an unbalanced output terminal, or a combination of an unbalanced input terminal and a balanced output terminal.

Moreover, the piezoelectric substrate may be formed of a piezoelectric single crystal such as $LiNbO_3$ and quartz, or a piezoelectric ceramic such as a titanate zirconate lead ceramic, instead of $LiTaO_3$. Otherwise, a substrate obtained by forming a piezoelectric thin film such as a ZnO thin film on an insulating substrate may be used as the piezoelectric substrate. In addition, the electrodes constituting the IDTs and the reflectors may be formed of an Al alloy, or a material such as Cu and Au, instead of Al. Otherwise, the electrodes may be formed by laminating a plurality of conductive materials.

Figure 25:
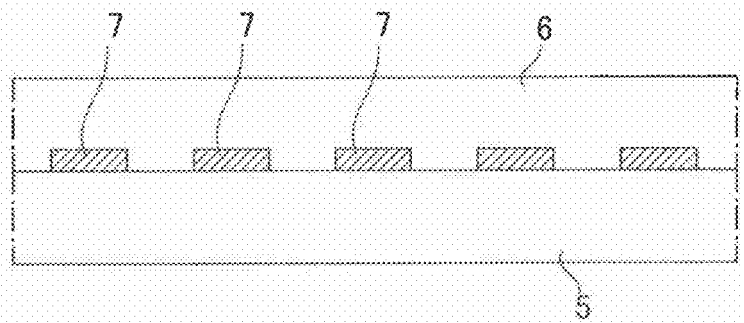
FIG. 25 is a conceptual diagram showing a boundary acoustic wave filter to which the present invention is applicable.

Furthermore, the present invention is applicable to not only the surface acoustic wave filter, but also the boundary acoustic wave filter which has IDTs and reflector electrodes 7 between a piezoelectric substrate 5 (for example, a $LiTaO_3$ substrate and a $LiNbO_3$ substrate) and a non-piezoelectric material 6 (for example, $SiO_2$ and Si) as shown in FIG. 25.

What is claimed is:

1. A surface acoustic wave filter comprising:
two or more interdigital transducers, provided on a piezoelectric substrate, and arranged in a propagation direction of a surface acoustic wave,
wherein said two or more interdigital transducers include at least one pair of interdigital transducers arranged adjacent to each other in order to be acoustically coupled to each other, and have different numbers of paired electrode fingers, and
a pitch between each neighboring two of almost all of the electrode fingers included in both of the pair of interdigital transducers are made different from one to another in order that the interdigital transducers should include no primary pitch area.

2. The surface acoustic wave filter according to claim 1,
wherein, in a case where the pitch between each neighboring two of almost all of the electrode fingers included in both of the pair of interdigital transducers are made different from one to another in order that the interdigital transducers should include no primary pitch area, at least one of the interdigital transducer transducers includes at least one pitch-decreasing area in which the pitch between the electrode fingers is progressively decreased, and at least one pitch-increasing area in which the pitch between the electrode fingers is progressively increased.

3. The surface acoustic wave filter according to claim 1,
wherein the surface acoustic wave filter is a longitudinally coupled resonator multi-mode type surface acoustic wave filter,
said two or more interdigital transducers arranged in the propagation direction of the surface acoustic wave include three or more interdigital transducers,
reflectors are arranged respectively at the two sides of a group consisting of the three or more interdigital transducers, and
a plurality of resonant modes are used in the three or more interdigital transducers.

4. The surface acoustic wave filter according to claim 3,
wherein at least one surface acoustic wave resonator is connected in series to the surface acoustic wave filter.

5. The surface acoustic wave filter according to claim 3,
wherein at least one surface acoustic wave resonator is connected in parallel to the surface acoustic wave filter.

6. A surface acoustic wave filter comprising:
an input terminal which is an unbalanced terminal,
output terminals which are balanced terminals,
a pair of surface acoustic wave filters which are made different from each other in the phase of an output signal by substantially 180 degrees and are electrically connected in parallel between the input terminal and the output terminals,
wherein the surface acoustic wave filter according to claim 1 is used for each of the pair of surface acoustic wave filters.

7. The surface acoustic wave filter according to claim 6,
wherein at least one surface acoustic wave resonator is connected in series to the surface acoustic wave filter.

8. The surface acoustic wave filter according to claim 6,
wherein at least one surface acoustic wave resonator is connected in parallel to the surface acoustic wave filter.

9. A surface acoustic wave filter comprising:
two or more interdigital transducers, provided on a piezoelectric substrate, and arranged in a propagation direction of a surface acoustic wave,
wherein said two or more interdigital transducers include at least one pair of interdigital transducers arranged adjacent to each other in order to be acoustically coupled to each other, and have different numbers of paired electrode fingers,
a pitch between each neighboring two of almost all of the electrode fingers included in one of the pair of interdigital transducers which has the smaller number of paired electrode fingers is made different from one to another in order that the interdigital transducer should include no primary pitch area, the one of the pair of interdigital transducers includes at least one pitch-decreasing area in which the pitch between the electrode fingers is progressively decreased, and at least one pitch-increasing area in which the pitch between the electrode fingers is progressively increased, and
in each of endmost ones of the two or more interdigital transducers arranged in the propagation direction of the surface acoustic wave, the pitch between the electrode fingers is progressively decreased from its outside to its inside, thereafter is reversely increased and subsequently is decreased again, in its inner end portion.

10. A boundary acoustic wave filter comprising:
a piezoelectric substrate;
a non-piezoelectric material arranged in contact with the piezoelectric substrate; and
two or more interdigital transducers, provided on an interface between the piezoelectric substrate and the non-piezoelectric material, and arranged in a propagation direction of boundary acoustic waves,
wherein said two or more interdigital transducers include at least one pair of interdigital transducers arranged adjacent to each other in order to be acoustically coupled to each other, and have different numbers of paired electrode fingers,
a pitch between each neighboring two of almost all of the electrode fingers included in one of the pair of interdigital transducers which has the smaller number of paired electrode fingers is made different from one to another in order that the interdigital transducer should include no primary pitch area, the one of the pair of interdigital transducers includes at least one pitch-decreasing area in which the pitch between the electrode fingers is progressively decreased, and at least one pitch-increasing area in which the pitch between the electrode fingers is progressively increased, and
in each of endmost ones of the two or more interdigital transducers arranged in the propagation direction of the surface acoustic wave, the pitch between the electrode fingers is progressively decreased from its outside to its inside, thereafter is reversely increased and subsequently is decreased again, in its inner end portion.

11. A surface acoustic wave filter comprising:
three or more interdigital transducers, provided on a piezoelectric substrate, and arranged in a propagation direction of a surface acoustic wave,
wherein said three or more interdigital transducers include at least one pair of interdigital transducers arranged adjacent to each other in order to be acoustically coupled to each other, and have different numbers of paired electrode fingers,
a pitch between each neighboring two of almost all of the electrode fingers included in one of the pair of interdigital transducers which has the smaller number of paired electrode fingers is made different from one to another in order that the interdigital transducer should include no primary pitch area, the one of the pair of interdigital transducers transducer includes at least one pitch-decreasing area in which the pitch between the electrode fingers is progressively decreased, and at least one pitch-increasing area in which the pitch between the electrode fingers is progressively increased, and
among said three or more interdigital transducers arranged in the propagation direction of the surface acoustic wave, an interdigital transducer interposed between its two neighboring interdigital transducers has a pitch change as a whole in which the pitch between the electrode fingers is larger in its central portion and is decreased gradually toward its two ends, and has an area in which the pitch between the electrode fingers is decreased in a part of its central portion.

12. A boundary acoustic wave filter comprising:
a piezoelectric substrate;
a non-piezoelectric material arranged in contact with the piezoelectric substrate; and
three or more interdigital transducers, provided on an interface between the piezoelectric substrate and the non-piezoelectric material, and arranged in a propagation direction of boundary acoustic waves,
wherein said three or more interdigital transducers include at least one pair of interdigital transducers arranged adjacent to each other in order to be acoustically coupled to each other, and have different numbers of paired electrode fingers,
a pitch between each neighboring two of almost all of the electrode fingers included in one of the pair of interdigital transducers which has the smaller number of paired electrode fingers is made different from one to another in order that the interdigital transducer should include no primary pitch area, the one of the pair of interdigital transducers includes at least one pitch-decreasing area in which the pitch between the electrode fingers is progressively decreased, and at least one pitch-increasing area in which the pitch between the electrode fingers is progressively increased, and
among said three or more interdigital transducers arranged in the propagation direction of the surface acoustic wave, an interdigital transducer interposed between its two neighboring interdigital transducers has a pitch change as a whole in which the pitch between the electrode fingers is larger in its central portion and is decreased gradually toward its two ends, and has an area in which the pitch between the electrode fingers is decreased in a part of its central portion.

13. A boundary acoustic wave filter comprising:
a piezoelectric substrate;
a non-piezoelectric material arranged in contact with the piezoelectric substrate; and
two or more interdigital transducers, provided on an interface between the piezoelectric substrate and the non-piezoelectric material, and arranged in a propagation direction of boundary acoustic waves,
wherein said two or more interdigital transducers include at least one pair of interdigital transducers arranged adjacent to each other in order to be acoustically coupled to each other, and have different numbers of paired electrode fingers, and
a pitch between each neighboring two of almost all of the electrode fingers included in both of the pair of interdigital transducers are made different from one to another in order that the interdigital transducers should include no primary pitch area.

14. The boundary acoustic wave filter according to claim 13,
wherein the boundary acoustic wave filter is a longitudinally coupled resonator multi-mode type boundary acoustic wave filter,
said two or more interdigital transducers arranged in the propagation direction of the surface acoustic wave include three or more interdigital transducers,
reflectors are arranged respectively at the two sides of a group consisting of the three or more interdigital transducers, and
a plurality of resonant modes are used in the three or more interdigital transducers.

15. The boundary acoustic wave filter according to claim 13,
wherein, in a case where the pitch between each neighboring two of almost all of the electrode fingers included in both of the pair of interdigital transducers are made different from one to another in order that the interdigital transducers should include no primary pitch area, at least one of the interdigital transducers includes at least one pitch-decreasing area in which the pitch between the electrode fingers is progressively decreased, and at least one pitch-increasing area in which the pitch between the electrode fingers is progressively increased.

16. A surface acoustic wave filter comprising:

two or more interdigital transducers, provided on a piezoelectric substrate, and arranged in a propagation direction of a surface acoustic wave, wherein said two or more interdigital transducers include at least one pair of interdigital transducers arranged adjacent to each other in order to be acoustically coupled to each other, and have different numbers of paired electrode fingers, a pitch between each neighboring two of almost all of the electrode fingers included in one of the pair of interdigital transducers which has the smaller number of paired electrode fingers is made different from one to another in order that the interdigital transducer should include no primary pitch area, the largest pitch between the electrode fingers in a first one of the pair of interdigital transducers which has the smaller number of paired electrode fingers is smaller than the largest pitch between the electrode fingers in a second one of the pair of interdigital transducers which has the larger number of paired electrode fingers, and the smallest pitch between the electrode fingers in the first one of the pair of interdigital transducers which has the smaller number of paired electrode fingers is larger than the smallest pitch between the electrode fingers in the second one of the pair of interdigital transducers which has the larger number of paired electrode fingers.

17. A boundary acoustic wave filter comprising:

a piezoelectric substrate;

a non-piezoelectric material arranged in contact with the piezoelectric substrate; and two or more interdigital transducers, provided on an interface between the piezoelectric substrate and the non-piezoelectric material, and arranged in a propagation direction of boundary acoustic waves, wherein said two or more interdigital transducers include at least one pair of interdigital transducers arranged adjacent to each other in order to be acoustically coupled to each other, and have different numbers of paired electrode fingers, a pitch between each neighboring two of almost all of the electrode fingers included in one of the pair of interdigital transducers which has the smaller number of paired electrode fingers is made different from one to another in order that the interdigital transducer should include no primary pitch area, the largest pitch between the electrode fingers in a first one of the pair of interdigital transducers which has the smaller number of paired electrode fingers is smaller than the largest pitch between the electrode fingers in a second one of the pair of interdigital transducers which has the larger number of paired electrode fingers, and the smallest pitch between the electrode fingers in the first one of the pair of interdigital transducers which has the smaller number of paired electrode fingers is larger than the smallest pitch between the electrode fingers in the second one of the pair of interdigital transducers which has the larger number of paired electrode fingers.

\* \* \* \* \*